(12) United States Patent
Seyama

(10) Patent No.: US 10,568,245 B2
(45) Date of Patent: Feb. 18, 2020

(54) ELECTRONIC-COMPONENT MOUNTING APPARATUS

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 154 days.

(21) Appl. No.: 15/680,207

(22) Filed: Aug. 18, 2017

(65) Prior Publication Data

US 2017/0347504 A1 Nov. 30, 2017

Related U.S. Application Data

(60) Division of application No. 14/948,385, filed on Nov. 23, 2015, now Pat. No. 9,968,020, which is a
(Continued)

(30) Foreign Application Priority Data

May 23, 2013 (JP) .................................. 2013-108658

(51) Int. Cl.
*H05K 13/04* (2006.01)
*H01L 23/00* (2006.01)
(Continued)

(52) U.S. Cl.
CPC ....... *H05K 13/04* (2013.01); *H01L 21/67144* (2013.01); *H01L 24/27* (2013.01); *H01L 24/75* (2013.01); *H01L 24/81* (2013.01); *H01L 24/83* (2013.01); *H01L 24/92* (2013.01); *H01L 24/97* (2013.01); *H05K 3/30* (2013.01); *H01L 24/13* (2013.01); *H01L 24/16* (2013.01); *H01L 24/29* (2013.01); *H01L 24/32* (2013.01); *H01L 2224/131* (2013.01); *H01L 2224/16225* (2013.01); *H01L 2224/16227* (2013.01); *H01L 2224/27318* (2013.01); *H01L 2224/2919* (2013.01); *H01L 2224/32225* (2013.01); *H01L 2224/7565* (2013.01); *H01L 2224/7598* (2013.01); *H01L 2224/75251* (2013.01); *H01L 2224/75252* (2013.01); *H01L 2224/75501* (2013.01); *H01L 2224/75611* (2013.01); *H01L 2224/75701* (2013.01); *H01L 2224/75702* (2013.01); *H01L 2224/75734* (2013.01);
(Continued)

(58) Field of Classification Search
CPC ... H05K 13/04; H05K 2203/1105; H05K 3/30
See application file for complete search history.

(56) References Cited

U.S. PATENT DOCUMENTS

| 7,712,652 B2 * | 5/2010 | Morita | H01L 24/81 228/180.22 |
| 8,819,929 B2 * | 9/2014 | Noda | H01L 21/67144 29/740 |
| 9,968,020 B2 * | 5/2018 | Seyama | H01L 24/27 |

* cited by examiner

*Primary Examiner* — Minh N Trinh
(74) *Attorney, Agent, or Firm* — JCIPRNET

(57) ABSTRACT

Provided is a flip chip mounting apparatus for mounting chips (400) to a substrate (200), and the apparatus includes at least one sectionalized mounting stage (45) divided into a heating section (452) and a non-heating section (456), the heating section being for heating a substrate (200) fixed to a front surface of the heating section, the non-heating section not heating the substrate (200) suctioned to a front surface of the non-heating section. With this, it is possible to provide an electronic-component mounting apparatus that is simple and capable of efficiently mounting a large number of electronic components.

2 Claims, 20 Drawing Sheets

Related U.S. Application Data continuation of application No. PCT/JP2014/057293, filed on Mar. 18, 2014.

(51) Int. Cl.
*H01L 21/67* (2006.01)
*H05K 3/30* (2006.01)

(52) U.S. Cl.
CPC ............... *H01L 2224/75744* (2013.01); *H01L 2224/75802* (2013.01); *H01L 2224/75804* (2013.01); *H01L 2224/75822* (2013.01); *H01L 2224/75824* (2013.01); *H01L 2224/81* (2013.01); *H01L 2224/81048* (2013.01); *H01L 2224/81815* (2013.01); *H01L 2224/83048* (2013.01); *H01L 2224/8385* (2013.01); *H01L 2224/83192* (2013.01); *H01L 2224/83862* (2013.01); *H01L 2224/83948* (2013.01); *H01L 2224/83986* (2013.01); *H01L 2224/9211* (2013.01); *H01L 2224/97* (2013.01); *H05K 2203/1105* (2013.01)

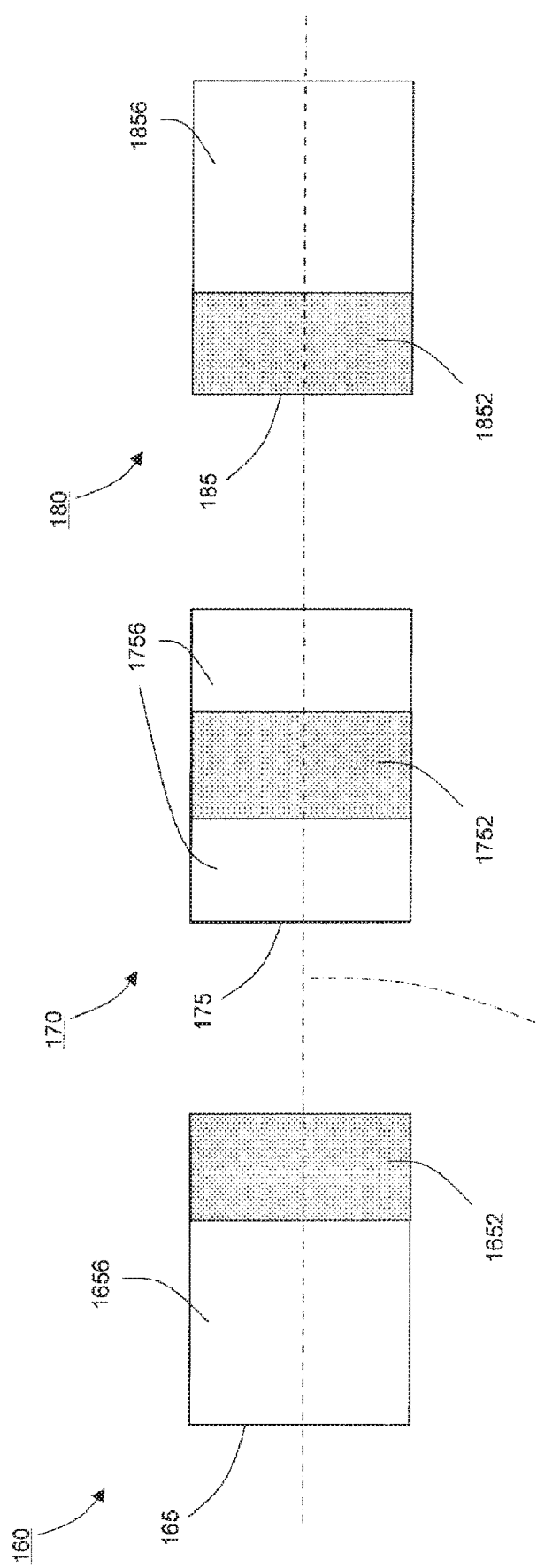

ELECTRONIC-COMPONENT MOUNTING APPARATUS

CROSS REFERENCE TO RELATED APPLICATIONS

This is a divisional application of and claims the priority benefit of U.S. Pat. No. 9,968,020, filed on Nov. 23, 2015. The prior U.S. Pat. No. 9,968,020 is a Continuation of PCT International Application No. PCT/JP2014/057293, filed on Mar. 18, 2014, which claims priority under 35 U.S.C § 119(a) to Patent Application No. 2013-108658, filed in Japan on May 23, 2013, all of which are hereby expressly incorporated by reference into the present application.

TECHNICAL FIELD

The present invention relates to a structure of an electronic-component mounting apparatus, in particular, a structure of a mounting stage of the electronic-component mounting apparatus, as well as to an electronic-component mounting method using such an electronic-component mounting apparatus.

BACKGROUND ART

As a method of mounting a chip as an electronic component on a circuit substrate, flip chip mounting in which bump electrodes also referred to as bumps are formed on the chip and the chip is directly mounted to the circuit substrate has become widely employed. The flip chip mounting is a method of joining a chip and a circuit substrate by forming a plurality of bumps (bump electrodes) on a circuit face of the chip using a material such as solder, and joining the bumps to a plurality of electrodes formed on the circuit substrate by heating and melting. As compared to the conventional wire mounting method, the flip chip mounting has various advantages such as a reduced mounting area, favorable electrical characteristics, and elimination of mold sealing.

In the flip chip mounting, resin sealing of an air gap between a chip and a circuit substrate by underfill or the like is required in order to ensure reliability of connection at a joint between the chip and the circuit substrate. However, using underfill poses a problem that it takes time to fill a liquid resin, as well as a problem that filling a liquid resin becomes difficult in view of recent circumstances that a gap between a chip and a circuit substrate has become increasingly narrower. Therefore, there has been employed a flip chip mounting method of: previously applying a thermosetting non-conductive paste (NCP) using a dispenser; pressing bumps of a chip to electrodes of a circuit substrate using a heated mounting tool to heat and melt the bumps and then electrically mount the chip to the circuit substrate; and at the same time thermally curing the non-conductive paste (NCP) to provide resin sealing between the chip and the circuit substrate (e.g., PTL 1).

Further, the number of chips mounted on a single substrate has been increased in recent years, and there are cases in which 100 to 200, or sometimes more than 1000 chips are mounted on one substrate. In order to efficiently perform mounting in such cases, a mounting apparatus having a plurality of mounting heads has been proposed (e.g., PTL 2).

CITATION LIST

Patent Literature

PTL 1: Japanese Unexamined Patent Application Publication No. 2005-150446

PTL 2: Japanese Unexamined Patent Application Publication No. 2005-72444

SUMMARY OF INVENTION

Technical Problem

In the meantime, when mounting a chip to a circuit substrate, mounting is performed by, for example, heating a mounting tool that suctions the chip up to about 300 degrees Celsius and heating the circuit substrate up to around 70 degrees Celsius. It usually takes about 15 to 20 seconds to mount a single chip. Accordingly, when about 100 chips are to be mounted on a single substrate, for example, it should take about 30 minutes to complete mounting of all of the chips after mounting is started.

Further, in many cases, mounting using a flip chip mounting apparatus is performed in a state in which a non-conductive paste (NCP) is first applied to all of positions on a substrate at which chips are to be mounted at ordinary temperature using a dispenser, and then the substrate is heated up to around 70 degrees Celsius. In a case in which about 100 chips are to be mounted on a single substrate, while a chip mounted at a first mounting position is mounted immediately after non-conductive paste (NCP) is heated up to 70 degrees Celsius, a chip mounted at a last mounting position is mounted about 30 minutes after the non-conductive paste (NCP) is heated up to 70 degrees Celsius.

However, being thermosetting, many non-conductive pastes (NCP) transform over time even at temperature around 70 degrees Celsius, and it is often required to perform mounting within 30 minutes after heating of the non-conductive paste (NCP) up to around 70 degrees Celsius. Therefore, if it takes about 15 to 20 seconds to mount a single chip, the number of chips that can be mounted successively after a non-conductive paste (NCP) is applied to a substrate using a dispenser and after the substrate is heated up to around 70 degrees Celsius is up to about 100 (the number of chips that can be mounted within 30 minutes after the substrate is heated up to around 70 degrees Celsius). If the number of chips to be mounted to a single substrate is more than this, it is necessary to cool the substrate once down to ordinary temperature at which the non-conductive paste (NCP) does not transform, and to perform mounting again after applying the non-conductive paste (NCP) to the substrate using the dispenser and after heating the substrate up to around 70 degrees Celsius. This can result in a problem of an increased size of equipment as a plurality of dispensers and an apparatus for cooling substrates are required, and a problem of extension of entire mounting time as it takes time to cool the substrate. These problems are not limited to the mounting of chips, and also applied to a case in which other electronic components such as LEDs are mounted on a substrate.

Thus, an object of the present invention is to provide an electronic-component mounting apparatus that is simple and capable of efficiently mounting a large number of electronic components.

Solution to Problem

An electronic-component mounting apparatus according to the present invention is an electronic-component mounting apparatus including: at least one sectionalized mounting stage divided into a heating section and a non-heating section, the heating section being for heating a substrate fixed to a front surface of the heating section, the non-heating section not heating the substrate suctioned to a front surface of the non-heating section, wherein the apparatus performs mounting of electronic components to the substrate.

It is preferable to configure the electronic-component mounting apparatus according to the present invention such that the sectionalized mounting stage includes: a planar base body having a planar stepped portion; and a heat insulating layer laid over the stepped portion such that a front surface of the heat insulating layer is in plane with a front surface of the base body, the substrate being fixed to the front surface of the base body and the front surface of the heat insulating layer, the heating section is the front surface of the base body, and the non-heating section is the front surface of the heat insulating layer.

It is also preferable to configure the electronic-component mounting apparatus according to the present invention to include: a first sectionalized mounting stage divided into a heating section and a non-heating section, the heating section being for heating a substrate fixed to a front surface of the heating section, the non-heating section not heating the substrate suctioned to a front surface of the non-heating section; and a second sectionalized mounting stage divided into a heating section and a non-heating section invertedly arranged with respect to the first sectionalized mounting stage.

It is also preferable to configure the electronic-component mounting apparatus according to the present invention to further include: at least one full heating mounting stage for heating the substrate as a whole that is fixed to a front surface of the full heating mounting stage.

An electronic-component mounting method according to the present invention is an electronic-component mounting method including the step of: mounting a plurality of electronic components to a substrate, the step including: a step of preparing an electronic-component mounting apparatus having: a first sectionalized mounting stage divided into a heating section and a non-heating section, the heating section being for heating a substrate fixed to a front surface of the heating section, the non-heating section not heating the substrate suctioned to a front surface of the non-heating section; and a second sectionalized mounting stage divided into a heating section and a non-heating section invertedly arranged with respect to the first sectionalized mounting stage; a paste application step of applying a non-conductive paste at positions on the substrate at which the electronic components are to be mounted using the electronic-component mounting apparatus; a first fixing step of fixing the substrate to the first sectionalized mounting stage; a first heating step of heating only a portion of the substrate that is fixed to the heating section of the first sectionalized mounting stage; a first mounting step of mounting the electronic components to the positions in the portion of the substrate that has been heated; a second fixing step of fixing the substrate to the second sectionalized mounting stage; a second heating step of heating only a portion of the substrate that is fixed to the heating section of the second sectionalized mounting stage; and a second mounting step of mounting the electronic components to the positions in the portion of the substrate that has been heated.

An electronic-component mounting method according to the present invention is an electronic-component mounting method including the step of: mounting a plurality of electronic components to a substrate, the step including: a step of preparing an electronic-component mounting apparatus having: a sectionalized mounting stage divided into a heating section and a non-heating section, the heating section being for heating a substrate fixed to a front surface of the heating section, the non-heating section not heating the substrate suctioned to a front surface of the non-heating section; and a full heating mounting stage for heating the substrate as a whole that is fixed to a front surface of the full heating mounting stage; a paste application step of applying a non-conductive paste at positions on the substrate at which the electronic components are to be mounted; a first fixing step of fixing the substrate to the sectionalized mounting stage; a first heating step of heating only a portion of the substrate that is fixed to the heating section of the sectionalized mounting stage; a first mounting step of mounting the electronic components to the positions in the portion of the substrate that has been heated; a third fixing step of fixing the substrate to the full heating mounting stage; a third heating step of heating the substrate as a whole; and a third mounting step of mounting the electronic components to the positions at which the electronic components have not been mounted in the first mounting step.

An electronic-component mounting method according to the present invention is an electronic-component mounting method including the step of: mounting a plurality of electronic components to a substrate, the step including: a step of preparing an electronic-component mounting apparatus having: a sectionalized mounting stage divided into a heating section and a non-heating section, the heating section being for heating a substrate fixed to a front surface of the heating section, the non-heating section not heating the substrate suctioned to a front surface of the non-heating section; a paste application step of applying a non-conductive paste at positions on the substrate at which the electronic components are to be mounted using the electronic-component mounting apparatus; a first fixing step of fixing the substrate to the sectionalized mounting stage; a first heating step of heating only a portion of the substrate that is fixed to the heating section of the sectionalized mounting stage; a first mounting step of mounting the electronic components to the positions in the portion of the substrate that has been heated; a fourth fixing step of rotating the substrate by 180 degrees within a horizontal plane, and of fixing a region to which the electronic components have not been mounted in the first mounting step to the heating section of the sectionalized mounting stage; a fourth heating step of heating only the portion of the substrate that is fixed to the heating section of the sectionalized mounting stage; and a fourth mounting step of mounting the electronic components to the positions in the portion of the substrate that has been heated.

Advantageous Effects of Invention

The present invention has an advantageous effect of providing an electronic-component mounting apparatus that is simple and capable of efficiently mounting a large number of electronic components.

BRIEF DESCRIPTION OF DRAWINGS

FIG. 15A is a plan view illustrating a configuration of a mounting stage of the flip chip mounting apparatus according to the different embodiment of the present invention.

FIG. 15B is a plan view illustrating a configuration of the mounting stage of the flip chip mounting apparatus according to the different embodiment of the present invention.

FIG. 15C is a plan view illustrating a configuration of the mounting stage of the flip chip mounting apparatus according to the different embodiment of the present invention.

DESCRIPTION OF EMBODIMENTS

Figure 1:
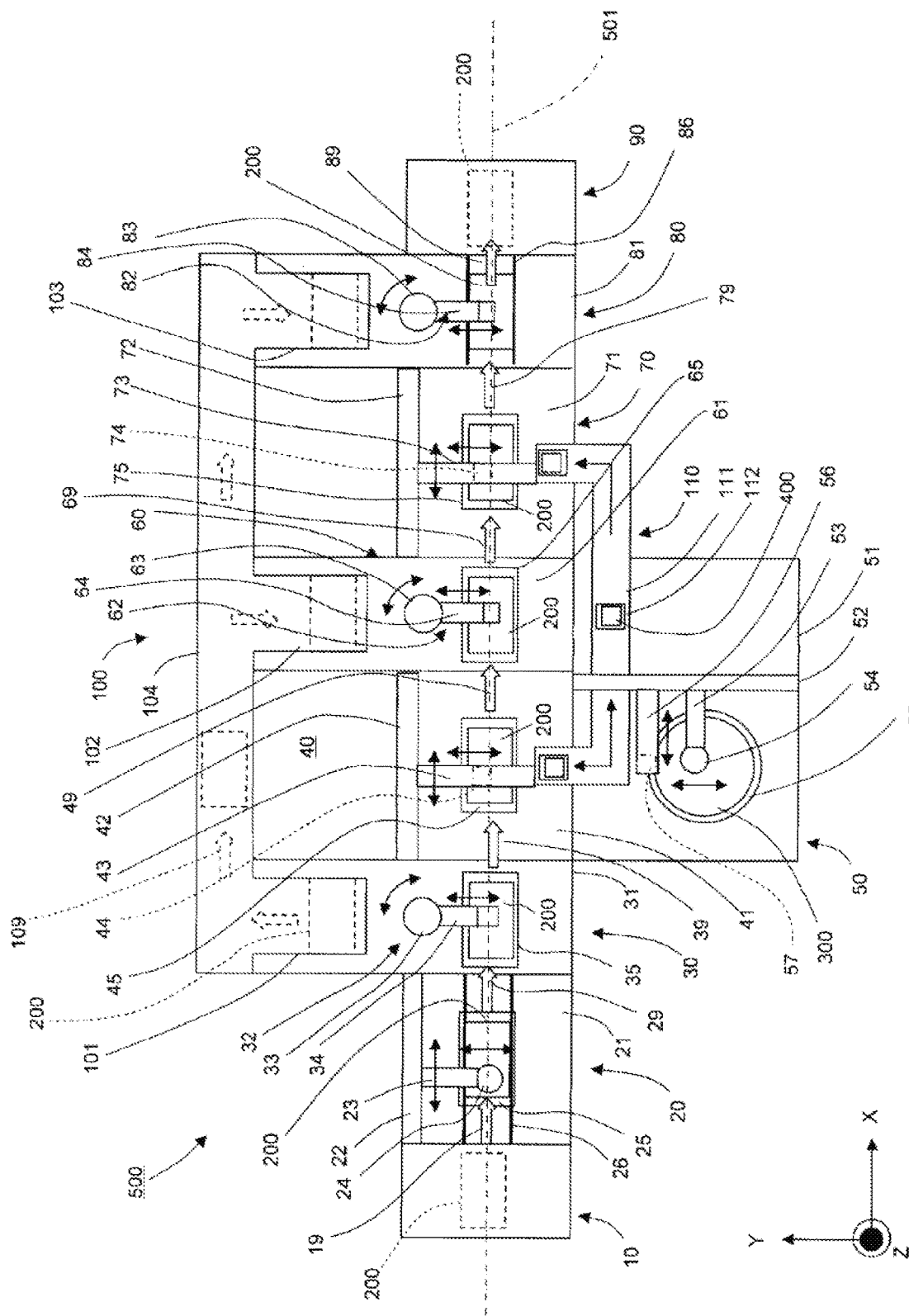
FIG. 1 is a plan view illustrating a configuration of a flip chip mounting apparatus according to an embodiment of the present invention.

Hereinafter, embodiments of the present invention applied to a flip chip mounting apparatus will be described with reference to the drawings. As illustrated in FIG. 1, a flip chip mounting apparatus 500 of this embodiment includes a substrate supply block 10, an NCP (non-conductive paste) application block 20, an upstream pre-heating block 30, an upstream mounting block 40, a downstream pre-heating block 60, a downstream mounting block 70, a product discharge block 80, a product storage block 90, a chip pick-up block 50, a chip carrying block 110, and a substrate bypass carrying block 100. Substrates 200 are carried from the substrate supply block 10 toward the product storage block 90 as indicated by white arrows 19, 29, 39, 49, 69, 79, and 89. In this embodiment, the description is given assuming that a carrying direction along which the substrates 200 are carried corresponds to X direction (in a direction along the center line 501), a horizontal direction perpendicular to the carrying direction of substrates corresponds to Y direction, and a direction vertical to a surface of each of the substrates 200 (height direction) corresponds to Z direction. In the following embodiment, the description is given assuming that suctioning or vacuum-suctioning is used as a method of fixing the substrate 200 to the upstream pre-heating block 30, the upstream mounting block 40, the downstream pre-heating block 60, and the downstream mounting block 70. However, the method of fixing the substrate 200 to the blocks 30, 40, 60, and 70 is not limited to suctioning and vacuum-suctioning, and the substrate 200 can be fixed using magnetic-suctioning, or an electromagnetic clamp and the like, for example.

The substrate supply block 10 has a substrate storage shelf that is not shown and provided within this block, and supplies the substrates 200 stored in the shelf one by one to the NCP application block 20.

Figure 5:
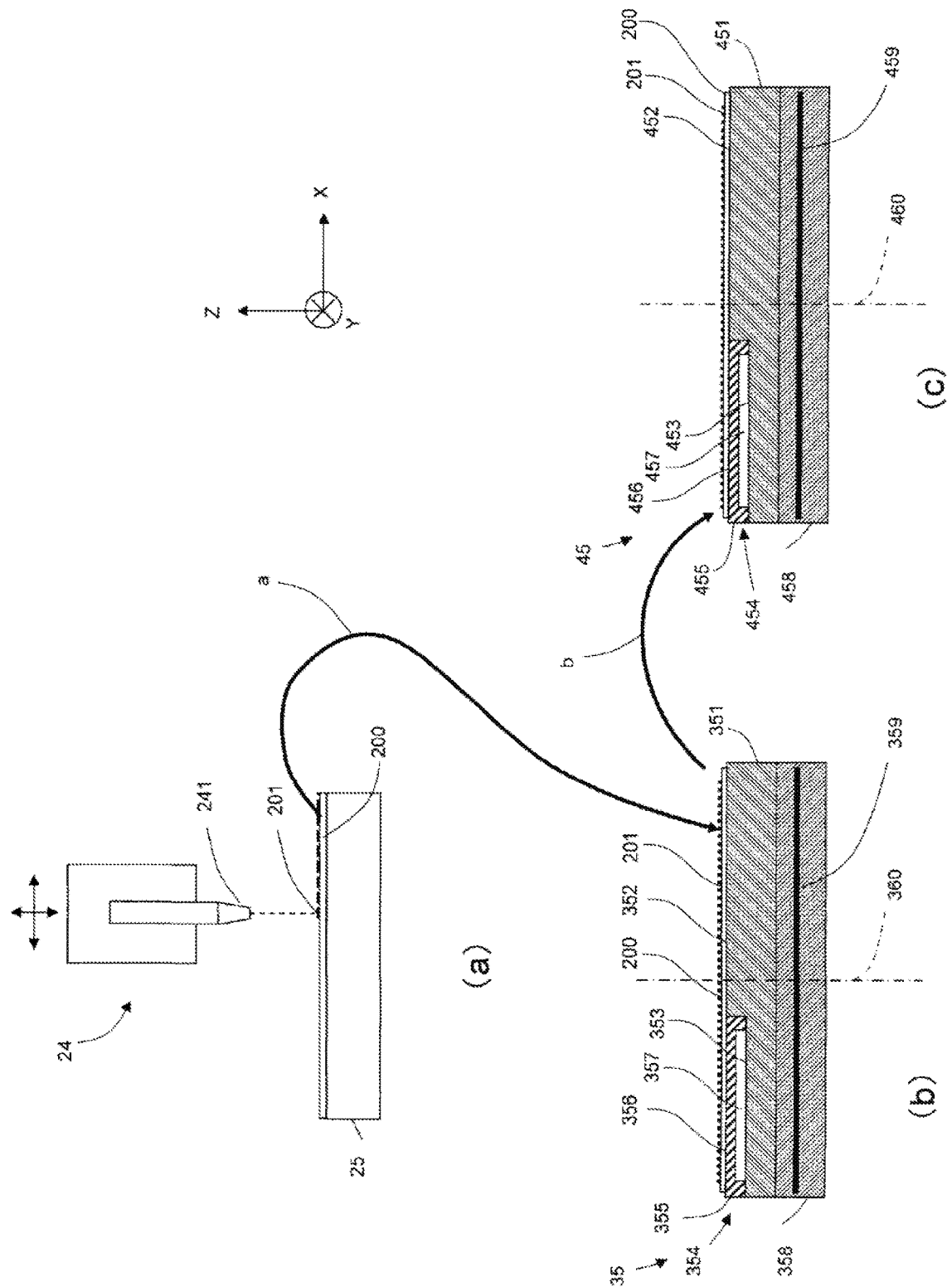
FIG. 5 is a view illustrating an NCP application step, an upstream pre-heating step, and a transfer step of transferring to the upstream mounting stage in a mounting process using the flip chip mounting apparatus according to the embodiment of the present invention.

The NCP application block 20 includes a frame 21, an X-direction guide 22 attached to the frame 21, a Y-direction guide 23 that moves in the X direction guided by the X-direction guide 22, a dispenser head 24 that moves in the Y direction guided by the Y-direction guide 23, a dispenser stage 25 on which the substrate 200 is suctioned and fixed, and a carrier rail 26 that carries the substrate 200 supplied from the substrate supply block 10 to the dispenser stage 25. The dispenser head 24 is configured to freely move in XY direction by the X-direction guide 22 and the Y-direction guide 23. Further, a dispenser 241 illustrated in FIG. 5(a) is attached to the dispenser head 24.

The upstream pre-heating block 30 includes a frame 31, a substrate carrying robot 32 attached to the frame 31, and an upstream pre-heating stage 35. The substrate carrying robot 32 includes a rotatable main body 33, and an extensible arm 34 attached to the main body 33. The arm 34 includes a hand for holding the substrate 200 at its tip (not shown), and is configured to pick the substrate 200 up from the dispenser stage 25, move the substrate 200 to the upstream pre-heating stage 35, place the substrate 200 on the upstream pre-heating stage 35, pick the substrate 200 up from the upstream pre-heating stage 35, move the substrate 200 to an upstream mounting stage 45, and place the substrate 200 on the upstream mounting stage 45.

The upstream mounting block 40 includes a frame 41, an X-direction frame 42 attached to the frame 41, a Y-direction frame 43 attached to the X-direction frame 42, an upstream mounting head 44 attached to the Y-direction frame 43, and the upstream mounting stage 45 on which the substrate 200 is suctioned and fixed. The upstream mounting stage 45 is attached to an XY table that is not shown and configured to move in the XY direction, and the upstream mounting head 44 is configured to freely move in Z direction. Further, an upstream mounting tool 441 illustrated in FIG. 7(n) is attached to the upstream mounting head 44.

Similarly to the upstream pre-heating block 30, the downstream pre-heating block 60 includes a frame 61, a substrate carrying robot 62 attached to the frame 61, and a downstream pre-heating stage 65. The substrate carrying robot 62 includes a rotatable main body 63, and an extensible arm 64 attached to the main body 63. The arm 64 includes a hand for holding the substrate 200 at its tip (not shown), and is configured to pick the substrate 200 up from the upstream mounting stage 45, move the substrate 200 to the downstream pre-heating stage 65, place the substrate 200 on the downstream pre-heating stage 65, pick the substrate 200 up from the downstream pre-heating stage 65, move the substrate 200 to a downstream mounting stage 75, and place the substrate 200 on the downstream mounting stage 75.

The downstream mounting block 70 includes a frame 71, an X-direction frame 72 attached to the frame 71, a Y-direction frame 73 attached to the X-direction frame 72, a downstream mounting head 74 attached to the Y-direction frame 73, and the downstream mounting stage 75 on which the substrate 200 is suctioned and fixed. The downstream mounting stage 75 is attached to an XY table that is not shown and configured to move in the XY direction, and the downstream mounting head 74 is configured to freely move in the Z direction. Further, a downstream mounting tool 741 illustrated in FIG. 9(t) is attached to the downstream mounting head 74.

The product discharge block 80 includes a frame 81, a substrate carrying robot 82 attached to the frame 81, and a carrier rail 86 attached to the frame 81. The substrate carrying robot 82 includes a rotatable main body 83, and the extensible arm 84 attached to the main body 83. The arm 84 includes a hand for holding the substrate 200 at its tip (not shown), and is configured to pick the substrate 200 up from the downstream mounting stage 75, move the substrate 200 to the carrier rail 86, and place the substrate 200 on the carrier rail 86. The carrier rail 86 carries the substrate 200 to the product storage block 90 using a carrier apparatus that is not shown.

The product storage block 90 has a substrate storage shelf that is not shown and provided within this block, and stores the substrate 200 to which mounting has been completed on each shelf. When a predetermined number of substrates 200 are stored on the shelves of the product storage block 90, the substrates 200 in the product storage block 90 are carried to a curing apparatus that is not shown.

The chip pick-up block 50 includes a frame 51, a pick up stage 55 that is attached to the frame 51 and on which a wafer 300 is suctioned and fixed, a pick up head 54 freely movable on the pick up stage 55 in the XY direction by a Y-direction guide 52 attached to the frame 51 and an X-direction guide 53 attached to the Y-direction guide 52, and a transfer head 57 attached to an X-direction guide 56 guided by the Y-direction guide 52 and freely movable in the XY direction. The pick up head 54 includes a pick up collet 541 rotatable about a rotational shaft 543 illustrated in FIG. 6(c). Further, as illustrated in FIG. 6(g) and FIG. 6(h), the transfer head 57 includes a transfer collet 571 for receiving a flipped chip 400 from the pick up collet 541 and moving the chip 400 to a transfer stage 112.

The chip carrying block 110 is a carrier path along which the transfer stage 112 (illustrated in FIG. 6(g) and FIG. 6(h)) for receiving the flipped chip 400 is carried to the upstream mounting block 40 and the downstream mounting block 70.

The substrate bypass carrying block 100 carries the substrate 200 from the upstream pre-heating block 30 to the downstream pre-heating block 60 or the product discharge block 80 bypassing the upstream mounting block 40 or the downstream mounting block 70.

Figure 2:
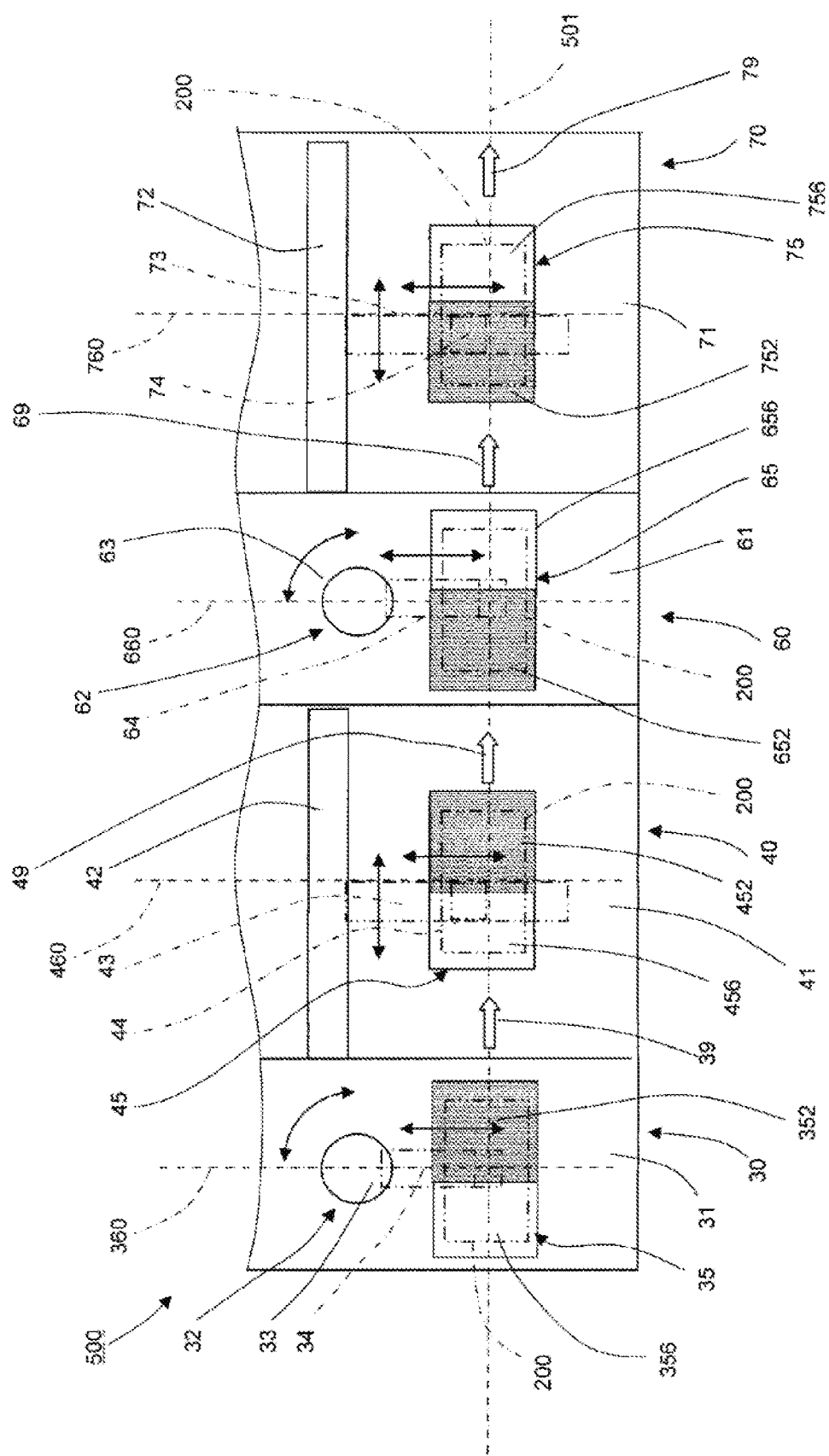
FIG. 2 is a plan view illustrating positioning of a mounting stage of the flip chip mounting apparatus according to the embodiment of the present invention.

As illustrated in FIG. 2, the upstream pre-heating stage 35, the upstream mounting stage 45, the downstream pre-heating stage 65, and the downstream mounting stage 75 are sectionalized mounting stages, each divided into corresponding one of heating sections 352, 452, 652, and 752 and corresponding one of non-heating sections 356, 456, 656, and 756. The heating sections 352, 452, 652, and 752 are for heating the substrate 200 suctioned to front surfaces of the respective sections, and the non-heating sections 356, 456, 656, and 756 are not heating the substrate 200 suctioned to front surfaces of the respective sections. The heating sections 352, 452, 652, and 752 are slightly wider than the non-heating sections 356, 456, 656, and 756, and respectively extend beyond central lines 360, 460, 660, and 760 in Y direction of the respective stages. The upstream pre-heating stage 35 and the upstream mounting stage 45 are a first type sectionalized stage and a first type sectionalized mounting stage divided into the heating sections 352 and 452 and the non-heating sections 356 and 456, respectively. The heating sections 352 and 452 are arranged in downstream of the carrying direction of the substrate 200, and the non-heating sections 356 and 456 are arranged in upstream of the carrying direction of the substrate 200. The downstream pre-heating stage 65 and the downstream mounting stage 75 are a second type sectionalized stage and a second type sectionalized mounting stage divided into the heating sections 652 and 752 and the non-heating sections 656 and 756, respectively. Contrary to the arrangement of the heating sections and the non-heating sections of the upstream pre-heating stage 35 and the upstream mounting stage 45 that are the first type sectionalized mounting stages, the heating sections 652 and 752 are arranged in the upstream of the carrying direction of the substrate 200, and the non-heating sections 656 and 756 are arranged in the downstream of the carrying direction of the substrate 200. The heating section 652 and the non-heating section 656 of the downstream pre-heating stage 65 are invertedly arranged about the central axis 360 along the Y direction with respect to the heating section 352 and the non-heating section 356 of the upstream pre-heating stage 35. Similarly, the heating section 752 and the non-heating section 756 of the downstream mounting stage 75 are invertedly arranged about the central axis 460 along the Y direction with respect to the heating section 452 and the non-heating section 456 of the upstream mounting stage 45.

Figure 3:
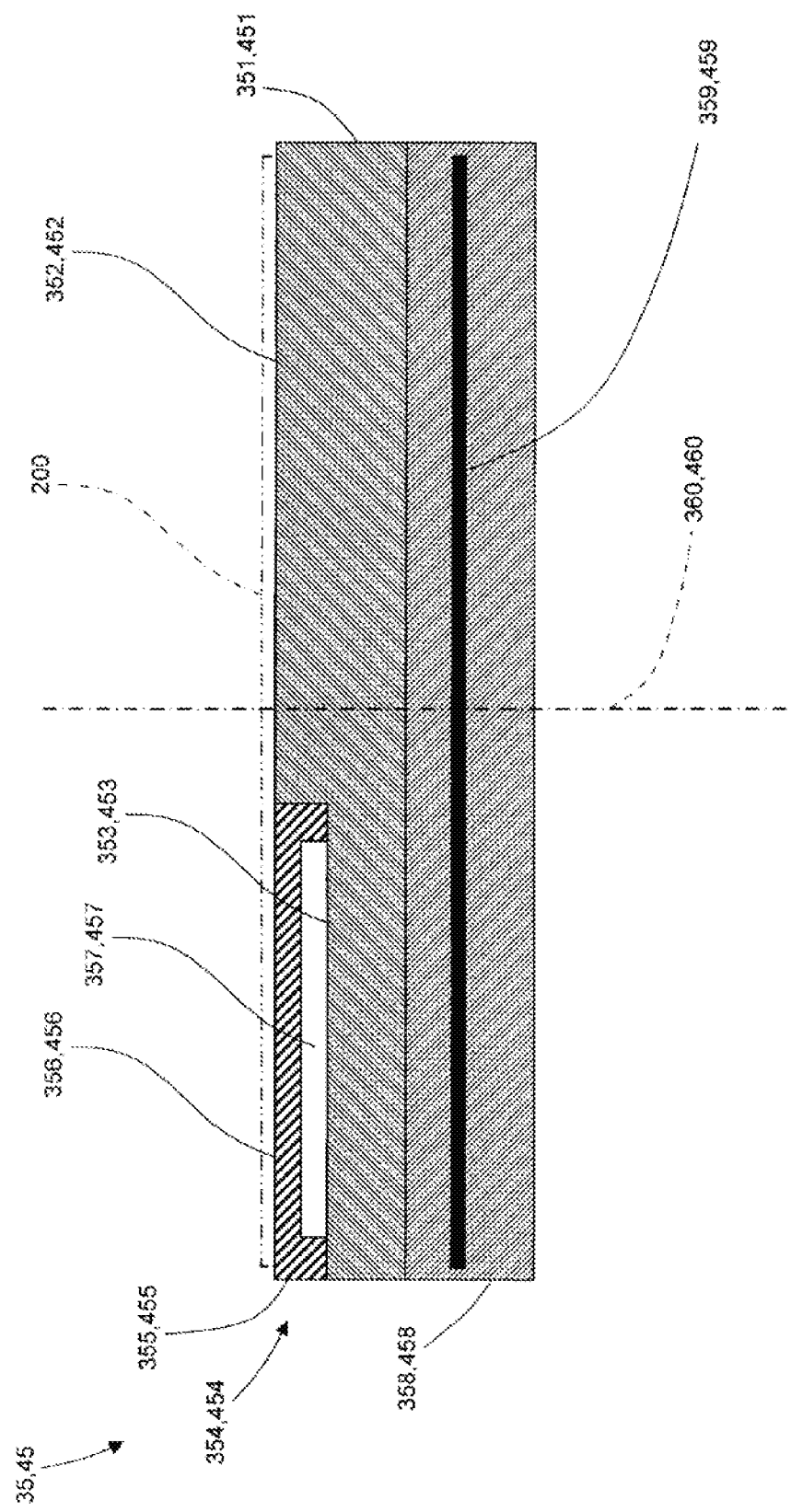
FIG. 3 is a sectional view of an upstream pre-heating stage and an upstream mounting stage of the flip chip mounting apparatus according to the embodiment of the present invention.

As illustrated in FIG. 3, the upstream pre-heating stage 35 includes a planar base body 351, a heat insulating layer 354, and a heater base 358, and the upstream mounting stage 45 includes a planar base body 451, a heat insulating layer 454, and a heater base 458. The planar base bodies 351 and 451 respectively have planar stepped portions 353 and 453 in the upstream of the carrying direction of the substrate 200, the heat insulating layers 354 and 454 are laid respectively over the stepped portions 353 and 453, and the heater bases 358 and 458 are laid respectively under the base bodies 351 and 451. The base bodies 351 and 451 are made of a highly thermally-conductive metal such as stainless steel, for example, and the heat insulating layers 354 and 454 are respectively include heat insulating spacers 355 and 455 made of a material with low thermal conductivity such as a plastic, for example. The heat insulating spacers 355 and 455 respectively include depressed portions 357 and 457 on surfaces on a side of the stepped portions 353 and 453 to form heat insulating layers of air between the heat insulating spacers 355 and 455 and front surfaces of the stepped portions 353 and 453, and thus provide effective thermal insulation from the front surfaces of the stepped portions 353 and 453. Further, the heater base 358 and 458 includes heaters 359 and 459 positioned therein. Front surfaces of the base bodies 351 and 451 respectively correspond to the heating sections 352 and 452, and front surfaces of the heat insulating spacers 355 and 455 respectively correspond to the non-heating sections 356 and 456. The heat insulating spacers 355 and 455 are respectively attached to the stepped portions 353 and 453 by fastening members such as bolts that are not shown, and can be removed and replaced easily. Similarly, the base bodies 351 and 451 are respectively attached to the heater bases 358 and 458 by fastening members such as bolts, and are configured to be easily replaced along with the heat insulating spacers 355 and 455.

Figure 4:
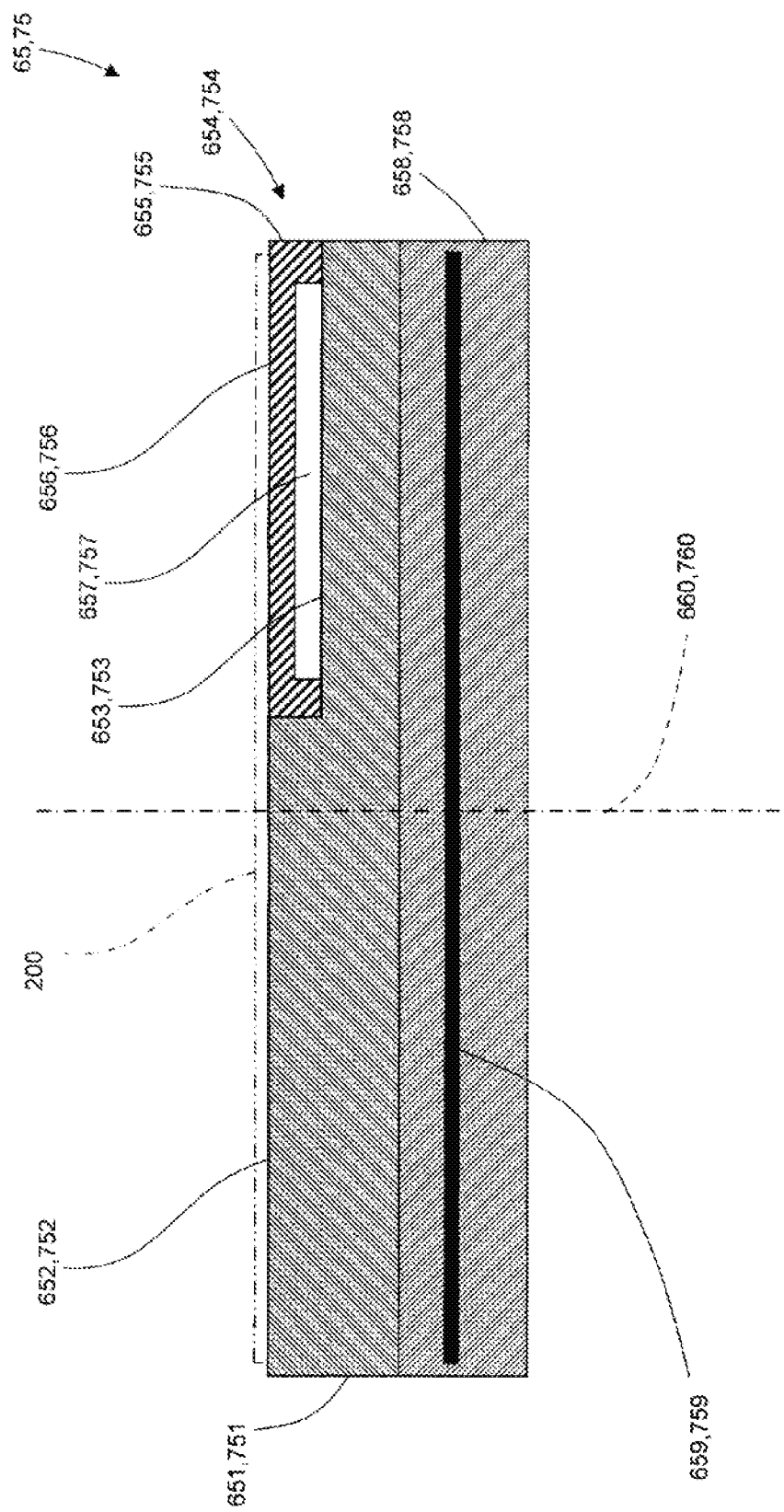
FIG. 4 is a sectional view of a downstream pre-heating stage and a downstream mounting stage of the flip chip mounting apparatus according to the embodiment of the present invention.

As illustrated in FIG. 4, the downstream pre-heating stage 65 and the downstream mounting stage 75 include the heating sections and the non-heating sections invertedly arranged about the central lines 360 and 460 with respect to the heating sections and the non-heating sections of the upstream pre-heating stage 35 and the upstream mounting stage 45. The downstream pre-heating stage 65 includes a planar base body 651, a heat insulating layer 654, and a heater base 658, and the downstream mounting stage 75 includes a planar base body 751, a heat insulating layer 754, and a heater base 758. The planar base bodies 651 and 751 respectively have planar stepped portions 653 and 753 in the downstream of the carrying direction of the substrate 200, the heat insulating layers 654 and 754 are laid respectively over the stepped portions 653 and 753, and the heater bases 658 and 758 are laid respectively under the base bodies 651 and 751. Front surfaces of the base bodies 651 and 751 respectively correspond to the heating sections 652 and 752, and front surfaces of heat insulating spacers 655 and 755 constituting the heat insulating layers 654 and 754 respectively correspond to the non-heating sections 656 and 756. Further, the heat insulating spacers 655 and 755 respectively include depressed portions 657 and 757 on surfaces on a side of the stepped portions 653 and 753 to form heat insulating layers of air between the heat insulating spacers 655 and 755 and front surfaces of the stepped portions 653 and 753, and thus provide effective thermal insulation from the front surfaces of the stepped portions 653 and 753. Similarly to the upstream pre-heating stage 35 and the upstream mounting stage 45, the heat insulating spacers 655 and 755 are respectively attached to the stepped portions 653 and 753 by fastening members such as bolts that are not shown, and the base bodies 651 and 751 are respectively attached to the heater bases 658 and 758 by fastening members such as bolts.

A process for mounting the chips 400 on the substrate 200 using the flip chip mounting apparatus 500 thus configured will be described with reference to FIG. 5 through FIG. 9.

The NCP application block 20 illustrated in FIG. 1 suctions and fixes the substrate 200 carried from the substrate supply block 10 onto the dispenser stage 25, and applies an NCP (non-conductive paste) 201, using the dispenser 241, to a plurality of positions on the substrate 200 at which chips 400 are to be mounted while moving the dispenser head 24 in XYZ direction as illustrated in FIG. 5(a). The application of the NCP (non-conductive paste) 201 is performed while the substrate 200 is at ordinary temperature (paste application step).

Upon application of the NCP (non-conductive paste) 201 to the predetermined positions on the substrate 200, the substrate 200 is picked up from the dispenser stage 25 by the substrate carrying robot 32 illustrated in FIG. 1, carried to the upstream pre-heating stage 35 as indicated by an arrow a in FIG. 5(a) and FIG. 5(b), and placed on the upstream pre-heating stage 35. The upstream pre-heating stage 35 suctions and fixes the substrate 200 on its front surface. As illustrated in FIG. 2 and FIG. 5(b), the upstream pre-heating stage 35 is the first type sectionalized stage divided into the heating section 352 arranged in the downstream of the carrying direction of the substrate 200 and the non-heating section 356 arranged in the upstream of the carrying direction of the substrate 200. A downstream region of the substrate 200 in the carrying direction that is slightly greater than a half of the substrate 200 (a part suctioned and fixed to the heating section 352) is heated up to around 70 degrees Celsius by the heater 359. With this, the temperature of the NCP (non-conductive paste) 201 applied to this region of the substrate 200 also increases up to around 70 degrees Celsius. In contrast, an upstream region of the substrate 200 in the carrying direction that is slightly smaller than the half of the substrate 200 (a part suctioned and fixed to the non-heating section 356) is not heated, as heat from the heater 359 is blocked by the heat insulating layer 354. Therefore, the temperature of this region is maintained at ordinary temperature or slightly higher than ordinary temperature. With this, the temperature of the NCP (non-conductive paste) 201 applied to this region of the substrate 200 is also maintained at ordinary temperature or slightly higher than ordinary temperature.

Then, when the temperature of the part of the substrate 200 suctioned and fixed to the heating section 352 increases up to around 70 degrees Celsius, the substrate 200 is picked up from the upstream pre-heating stage 35 by the substrate carrying robot 32 illustrated in FIG. 1, carried to the upstream mounting stage 45 as indicated by an arrow b in FIG. 5(b) and FIG. 5(c), and placed on the upstream mounting stage 45. The upstream mounting stage 45 suctions and fixes the substrate 200 on its front surface (first suction (fixing) step).

Similarly to the upstream pre-heating stage 35, the upstream mounting stage 45 is the first type sectionalized stage divided into the heating section 452 arranged in the downstream of the carrying direction of the substrate 200 and the non-heating section 456 arranged in the upstream of the carrying direction of the substrate 200. The downstream region of the substrate 200 in the carrying direction that is slightly greater than the half of the substrate 200 (a part suctioned and fixed to the heating section 452) is maintained at the temperature around 70 degrees Celsius by the heater 459, and the temperature of the NCP (non-conductive paste) 201 applied to this region of the substrate 200 is also maintained at the temperature around 70 degrees Celsius. In the upstream region of the substrate 200 in the carrying direction that is slightly smaller than the half of the substrate 200 (a part suctioned and fixed to the non-heating section 456), heat from the heater 459 is blocked by the heat insulating layer 454. Therefore, the temperature of this region is maintained at ordinary temperature or slightly higher than ordinary temperature. The temperature of the NCP (non-conductive paste) 201 applied to this region of the substrate 200 is also maintained at ordinary temperature or slightly higher than ordinary temperature (first heating step).

In contrast, as illustrated in FIG. 6(c), the chip 400 diced from the wafer 300 illustrated in FIG. 1 is held on an upper surface 551 of the pick up stage 55. Bumps 401 are formed on a mounting surface (upper side surface in FIG. 6(c)) of the chip 400. First, as illustrated by an arrow c in FIG. 6(c), the pick up collet 541 moves down toward the mounting surface of the chip 400 to be picked up. As illustrated in FIG. 6(d), as the pick up collet 541 moves down toward the chip 400 and a suction surface 542 at a tip of the pick up collet 541 is brought into contact with the mounting surface of the chip 400, the chip 400 is suctioned to the suction surface 542 at the tip of the pick up collet 54. Then, as the pick up collet 541 moves upward as indicated by an arrow e in FIG. 6(e), the chip 400 is picked up from the upper surface 551 of the pick up stage 55. As illustrated in FIG. 6(e), after the chip 400 is picked up, the suction surface 542 of the pick up collet 541 that has been faced down is flipped up by rotating the rotational shaft 543 of the pick up collet 541 by 180 degrees in a direction of an arrow f in FIG. 6(f), and the chip 400 is invertedly so that a front surface 402 of the chip 400 (a surface opposite to the mounting surface on which the bumps 401 are formed) faces upward in FIG. 6(f).

As indicated by a white arrow g1 in FIG. 6(g), while the suction surface 542 of the pick up collet 541 is maintained facing upward, the pick up head 54 holding the chip 400 is moved in the XY direction to move the pick up collet 541 to a position for transferring the chip 400 to the transfer collet 571. Further, as indicated by a white arrow g2 in FIG. 6(g), the transfer head 57 also moves the transfer collet 571 to the position for transferring. Then, as indicated by an arrow g in FIG. 6(g), a suction surface 572 of the transfer collet 571 is moved down to the front surface 402 of the chip 400 suctioned to the suction surface 542 of the flipped pick up collet 541. Thereafter, when the suction surface 572 of the transfer collet 571 is brought into contact with the front surface 402 of the chip 400, suctioning of the chip 400 by the pick up collet 541 is released, and the chip 400 is suctioned to the suction surface 572 of the transfer collet 571 and transferred from the pick up collet 541 to the transfer collet 571.

As indicated by an arrow h in FIG. 6(h), the transfer head 57 moves the transfer collet 571 that has received the chip 400 to a position for transferring the chip 400 to the transfer stage 112. Then, the transfer collet 571 is moved down to the transfer stage 112, and the chip 400 is transferred to a front surface 113 of the transfer stage 112. The chip 400 is placed on the front surface 113 of the transfer stage 112 in a state in which the front surface 402 faces up and the mounting surface on which the bumps 401 are formed faces down in the Z direction, and thus transferred to the transfer stage 112. After transferring the chip 400 to the front surface 113 of the transfer stage 112, the transfer head 57 moves upward away from the chip 400 as indicated by an arrow k in FIG. 7(k). The transfer stage 112 that has received the chip 400 is carried from the chip pick-up block 50 illustrated in FIG. 1 to the upstream mounting block 40 along a carrier path 111 of the chip carrying block 110, as indicated by a white arrow k2 in FIG. 7(k) and FIG. 7(m). In addition, as indicated by the arrow m in FIG. 7(m), the upstream mounting tool 441 moves down to the transfer stage 112.

As indicated by an arrow m in FIG. 7(m), when the transfer stage 112 is carried to the upstream mounting block 40, the upstream mounting head 44 moves the upstream mounting tool 441 down to the transfer stage 112 to bring a suction surface 442 in contact with the front surface 402 of the chip 400, and causes the suction surface 442 of the upstream mounting tool 441 to suction the chip 400. Upon suctioning of the chip 400 to the suction surface 442, the upstream mounting tool 441 heats the chip 400 up to about 300 degrees Celsius using a heater (not shown) provided in the tool, and mounts the chip 400 at a predetermined position in the part of the substrate 200 suctioned and fixed to the heating section 452 of the upstream mounting stage 45 as indicated by an arrow n in FIG. 7(n). As the temperature of the substrate 200 suctioned and fixed to the heating section 452 and the NCP (non-conductive paste) 201 applied to this region of the substrate 200 is about 70 degrees Celsius, when the chip 400 that has been heated up to around 300 degrees Celsius is mounted, the bumps 401 formed on the mounting surface of the chip 400 are melted and joined to the electrodes on the substrate 200, the NCP (non-conductive paste) 201 is heated and cured, and the chip 400 is fixed and mounted on the substrate 200 (first mounting step).

In this first mounting step, mounting of the chips 400 to the substrate 200 is performed, along a line on a rightmost side (in positive X direction) in FIG. 7(n), from a back side (in positive Y direction) in the figure to a front side (in negative Y direction) in the figure. Upon completion of mounting of the chips 400 along the line on the rightmost side shown in FIG. 7(n), the upstream mounting stage 45 is moved by an amount of one chip in the positive X direction by the XY table that is not shown, and mounting of the chips 400 is performed along a line on a side next to the rightmost side. Thereafter, upon completion of mounting of the chips 400 along every single line, the upstream mounting stage 45 is moved by an amount of one chip in the positive X direction by the XY table that is not shown, and mounting of the chips 400 along a next line is performed. Then, when the chips 400 are mounted to all of the predetermined positions on the substrate 200 suctioned and fixed to the heating section 452 of the upstream mounting stage 45, the first mounting step on the upstream mounting stage 45 is terminated.

At this time, the chips 400 are not mounted on the part of the substrate 200 suctioned to the non-heating section 456 of the upstream mounting stage 45 in the upstream of the carrying direction of the substrate 200 (X direction). As heat from the heater 459 to this part is blocked by the heat insulating layer 454, the temperature of this part is maintained at ordinary temperature or slightly higher than ordinary temperature. Accordingly, the substrate 200 and the NCP (non-conductive paste) 201 applied to the substrate 200 are also maintained at ordinary temperature or the temperature slightly higher than ordinary temperature. Therefore, in the upstream region of the substrate 200 in the carrying direction that is slightly smaller than the half of the substrate 200 on the upstream mounting stage 45, the temperature of the NCP (non-conductive paste) 201 is maintained at ordinary temperature or slightly higher than ordinary temperature during mounting of the chips 400. Thus, it is possible to suppress transformation due to an increase of the temperature of the NCP (non-conductive paste) 201.

Upon completion of mounting of the chips 400 to the predetermined positions in the part of the substrate 200 suctioned and fixed to the heating section 452 of the upstream mounting stage 45, the substrate 200 is picked up by the substrate carrying robot 62 illustrated in FIG. 1 from the upstream mounting stage 45, carried to the downstream pre-heating stage 65 as indicated by an arrow p in FIG. 8(p), and placed on the downstream pre-heating stage 65. The downstream pre-heating stage 65 suctions and fixes the substrate 200 on its front surface.

When suctioned and fixed onto the downstream pre-heating stage 65, the part of the substrate 200 to which the chips 400 have been mounted on the upstream mounting stage 45, or the part of the substrate 200 that has been suctioned and fixed to the heating section 452 of the upstream mounting stage 45 (the downstream region slightly greater than the half of the substrate 200), is maintained at the temperature around 70 degrees Celsius. In contrast, the part of the substrate 200 to which the chips 400 are not mounted, or the part of the substrate 200 that has been suctioned and fixed to the non-heating section 456 of the upstream mounting stage 45 (the upstream region slightly smaller than the half of the substrate 200), is maintained at ordinary temperature or the temperature slightly higher than ordinary temperature.

As illustrated in FIG. 2 and FIG. 8(p), the downstream pre-heating stage 65 is the second type sectionalized stage divided into the heating section 652 arranged in the upstream of the carrying direction of the substrate 200 and the non-heating section 656 arranged in the downstream of the carrying direction of the substrate 200. The upstream region of the substrate 200 in the carrying direction that is slightly greater than the half of the substrate 200 (the part suctioned and fixed to the heating section 652) is heated up to around 70 degrees Celsius by a heater 659. With this, the part of the substrate 200 at ordinary temperature or slightly higher than ordinary temperature and at which the chips 400 are not mounted, or the part of the substrate 200 suctioned and fixed to the non-heating section 456 of the upstream mounting stage 45 (the upstream region slightly smaller than the half of the substrate 200) is heated up to around 70 degrees Celsius from ordinary temperature or the temperature slightly higher than ordinary temperature, and the temperature of the NCP (non-conductive paste) 201 applied to this region of the substrate 200 also increases up to around 70 degrees Celsius.

In contrast, the part of the substrate 200 to which the chips 400 have been mounted on the upstream mounting stage 45, or the part of the substrate 200 that has been suctioned and fixed to the heating section 452 of the upstream mounting stage 45 (the downstream region slightly greater than the half of the substrate 200) is suctioned and fixed to a region of the downstream pre-heating stage 65 that is slightly smaller than a half of the downstream pre-heating stage 65 in the downstream of the carrying direction of the substrate 200 at the temperature around 70 degrees Celsius (the part that is suctioned and fixed to the non-heating section 656). As heat from the heater 659 is blocked in this region by heat insulating layer 654, the temperature of the part of the substrate 200 to which the chips 400 are mounted gradually decreases from around 70 degrees Celsius. Therefore, the temperature of the NCP (non-conductive paste) 201 applied to this region of the substrate 200 also gradually decreases from around 70 degrees Celsius.

Then, when the temperature of the part of the substrate 200 suctioned and fixed to the heating section 652 increases up to around 70 degrees Celsius, the substrate 200 is picked up from the downstream pre-heating stage 65 by the substrate carrying robot 62 illustrated in FIG. 1, and carried above and placed on the downstream mounting stage 75 as indicated by an arrow q in FIG. 8(p) and FIG. 8(q). The downstream mounting stage 75 suctions and fixes the substrate 200 onto its front surface (second suction (fixing) step).

Similarly to the downstream pre-heating stage 65, the downstream mounting stage 75 is the second type sectionalized stage divided into the heating section 752 arranged in the upstream of the carrying direction of the substrate 200 and the non-heating section 756 arranged in the downstream of the carrying direction of the substrate 200. The upstream region of the substrate 200 in the carrying direction that is slightly greater than the half of the substrate 200 (a part suctioned and fixed to the heating section 752) is maintained at the temperature around 70 degrees Celsius by a heater 759, and the temperature of the NCP (non-conductive paste) 201 applied to this region of the substrate 200 is also maintained at the temperature around 70 degrees Celsius. In the downstream region of the substrate 200 in the carrying direction that is slightly smaller than the half of the substrate 200 (a part suctioned and fixed to the non-heating section 756), heat from the heater 759 is blocked by the heat insulating layer 754. Therefore, the temperature of this region decreases down below the temperature when this region is placed on the downstream pre-heating stage 65 (second heating step).

As previously described with reference to FIG. 6(c) through FIG. 7(k), the chip 400 on the upper surface 551 of the pick up stage 55 is picked up by the pick up collet 541, flipped by 180 degrees, transferred to the transfer collet 571, and further transferred from the transfer collet 571 to the transfer stage 112. After transferring the chip 400 to the front surface 113 of the transfer stage 112, the transfer head 57 moves upward away from the chip 400 as indicated by an arrow r in FIG. 9(r). Then, the transfer stage 112 that has received the chip 400 is carried from the chip pick-up block 50 illustrated in FIG. 1 to the downstream mounting block 70 along the carrier path 111 of the chip carrying block 110, as indicated by a white arrow r2 in FIG. 9(r) and FIG. 9(s). In addition, as indicated by the arrow s in FIG. 9(s), the downstream mounting tool 741 moves down to the transfer stage 112.

As indicated by an arrow s in FIG. 9(s), when the transfer stage 112 is carried to the downstream mounting block 70, the downstream mounting head 74 moves the downstream mounting tool 741 down above the transfer stage 112, brings a suction surface 742 of the downstream mounting tool 741 in contact with the front surface 402 of the chip 400, and causes the suction surface 742 of the downstream mounting tool 741 to suction the chip 400. Upon suctioning of the chip 400 to the suction surface 742, the downstream mounting tool 741 heats the chip 400 up to about 300 degrees Celsius using a heater (not shown) provided in the tool, and mounts the chip 400 at a predetermined position in the part of the substrate 200 suctioned and fixed to the heating section 752 of the downstream mounting stage 75 as indicated by an arrow t in FIG. 9(t). As the temperature of the substrate 200 suctioned and fixed to the heating section 752 and the NCP (non-conductive paste) 201 applied to this region of the substrate 200 is about 70 degrees Celsius, when the chip 400 that has been heated up to around 300 degrees Celsius is mounted, the bumps 401 formed on the mounting surface of the chip 400 are melted and joined to the electrodes on the substrate 200, the NCP (non-conductive paste) 201 is heated and cured, and the chip 400 is fixed and mounted on the substrate 200 (second mounting step).

In the second mounting step, mounting of the chips 400 to the substrate 200 is performed along a line next to the line of the chips 400 last mounted in the first mounting step, that is, along a line on a rightmost side (in positive X direction) in the heating section 752 of the downstream mounting stage 75 illustrated in FIG. 9(t), from the back side (in positive Y direction) in the figure to the front side (in negative Y direction) in the figure. Upon completion of mounting of the chips 400 along this line, the downstream mounting stage 75 is moved by an amount of one chip in the positive X direction by the XY table that is not shown, and mounting of the chips 400 is performed along a next line. Thereafter, upon completion of mounting of the chips 400 along every single line, the downstream mounting stage 75 is moved by an amount of one chip in the positive X direction by the XY table that is not shown, and mounting of the chips 400 along a next line is performed. Then, when the chips 400 are mounted to all of the predetermined positions on the substrate 200 suctioned and fixed to the heating section 752 of the downstream mounting stage 75, the second mounting step on the downstream mounting stage 75 is terminated.

Upon completion of mounting of the chips 400 to the predetermined positions in the part of the substrate 200 suctioned and fixed to the heating section 752 of the downstream mounting stage 75, the substrate 200 is picked up by the substrate carrying robot 82 illustrated in FIG. 1 from the downstream mounting stage 75, and carried to and placed on the carrier rail 86. The substrate 200 that is finished as a product upon completion of mounting of all the chips 400 is carried along the carrier rail 86 to the product storage block 90 by a carrier apparatus that is not shown. When a predetermined number of the substrates 200 are stored on the shelves of the product storage block 90, the substrates 200 in the product storage block 90 are carried to a curing apparatus that is not shown, and are subjected to curing for about an hour at temperature around 200 degrees Celsius, for example. With this, the NCP (non-conductive paste) 201 is fully cured.

As described above, in this embodiment, only the region of the substrate 200 that is a substantial half in the downstream of the carrying direction is heated up to around 70 degrees Celsius on the upstream pre-heating stage 35 and maintained at about 70 degrees Celsius on the upstream mounting stage 45, and the chips 400 are mounted only to this region. In the meantime, the region of the substrate 200 that is a substantial half in the upstream of the carrying direction is maintained at ordinary temperature or at temperature slightly higher than ordinary temperature to suppress transformation of the NCP (non-conductive paste) 201 applied to this region. On the downstream pre-heating stage 65 and the downstream mounting stage 75, the region of the substrate 200 that is the substantial half in the upstream of the carrying direction that has been maintained at ordinary temperature or at temperature slightly higher than ordinary temperature is heated up to around 70 degrees Celsius, and mounting of the chips 400 to this region is performed. Therefore, it is possible to maintain the upstream half of the substrate 200 at ordinary temperature or at temperature slightly higher than ordinary temperature during mounting of the chips 400 to the downstream half of the substrate 200, and to suppress transformation of the NCP (non-conductive paste) 201 due to heat before mounting of the chips to the upstream half of the substrate 200. Accordingly, maximum waiting time for mounting the chip 400 in the state in which the NCP (non-conductive paste) 201 is heated up to around 70 degrees Celsius after application to the substrate 200 corresponds to time for mounting the chips 400 to either the upstream or the downstream half region of the substrate 200. While the waiting time in the conventional flip chip mounting apparatus in which maximum waiting time for mounting the chip 400 in the state in which the NCP (non-conductive paste) 201 is heated up to around 70 degrees Celsius after application to the substrate 200 corresponds to time for mounting the chips 400 to an entire surface of the substrate 200, the waiting time in the flip chip mounting apparatus 500 according to this embodiment is reduced by about half. Therefore, in the flip chip mounting apparatus 500 according to this embodiment, the number of the chips 400 that can be mounted before the NCP (non-conductive paste) 201 applied to the substrate 200 transforms due to heat is twice as large as that in the conventional flip chip mounting apparatus. Specifically, this embodiment provides an effect of allowing to mount a large number of chips 400 on the substrate 200, while suppressing transformation of the NCP (non-conductive paste) 201 due to heat.

Further, in this embodiment, the downstream region of the substrate 200 that is substantially half of the substrate 200 and to which mounting on the upstream mounting stage 45 has been completed is not heated on the downstream pre-heating stage 65 and the downstream mounting stage 75. Accordingly, a time period after application of the NCP (non-conductive paste) 201 to the substrate 200 until mounting of all the chips 400 on the downstream mounting stage 75 is completed is substantially identical to a time period during which the NCP (non-conductive paste) 201 applied to the substrate 200 is heated at around 70 degrees Celsius. Therefore, it is possible to provide an effect of substantially evenly curing the NCP (non-conductive paste) 201.

In the above description, the flip chip mounting apparatus 500 according to this embodiment has the substrate 200 be carried sequentially to the substrate supply block 10, the NCP (non-conductive paste) application block 20, the upstream pre-heating block 30, and the upstream mounting block 40 as indicated by the white arrows 19, 29, and 39 in FIG. 1 to mount the chips 400 to the downstream half of the substrate 200, and then the substrate 200 be carried sequentially to the downstream pre-heating block 60 and the downstream mounting block 70 as indicated by the white arrows 49 and 69 to mount the chips 400 to the upstream half of the substrate 200. However, various methods of mounting can be employed as described below.

For example, when it is desired to mount the chips 400 only to the upstream half of the substrate, it is possible to perform mounting of the chips 400 by: applying the NCP (non-conductive paste) 201 only to the upstream half of the substrate 200 in the NCP application block 20; causing the substrate carrying robot 32 to pick up the substrate 200 from the dispenser stage 25 and to place the substrate 200 on an upstream pre-heating block line 101 of the substrate bypass carrying block 100; carrying the substrate 200 along an X-direction carrier line 104 and a downstream pre-heating block line 102 as indicated by a white arrow 109 in FIG. 1; causing the substrate carrying robot 62 to pick up the substrate 200 from the downstream pre-heating block line 102 and to place the substrate 200 on the downstream pre-heating stage 65; and then mounting the chips 400 only to the upstream half of the substrate 200 in the downstream pre-heating block 60 and the downstream mounting block 70. Further, in an opposite manner, when it is desired to mount the chips 400 only to the downstream half of the substrate, it is possible to perform mounting of the chips 400 by: sequentially carrying the substrate 200 to the substrate supply block 10, the NCP (non-conductive paste) application block 20, the upstream pre-heating block 30, and the upstream mounting block 40; mounting the chips 400 to the downstream half of the substrate 200; causing the substrate carrying robot 62 to pick up the substrate 200 from the upstream mounting stage 45 and to place the substrate 200 on the downstream pre-heating block line 102 of the substrate bypass carrying block 100; carrying the substrate 200 along the X-direction carrier line 104 and a product discharge block line 103; causing the substrate carrying robot 82 to pick up the substrate 200 from the product discharge block line 103 and to place the substrate 200 on the carrier rail 86 of the product discharge block 80.

Moreover, when the substrate 200 is equal to or smaller than a half of the stages 25, 35, 45, 65, and 75, it is possible to perform mounting of the chips 400 by: applying the NCP (non-conductive paste) 201 in the NCP application block 20; carrying the substrates 200 to the upstream pre-heating block 30 and the upstream mounting block 40 with the downstream pre-heating block 60 and the downstream mounting block 70 using the substrate carrying robot 32 and the substrate bypass carrying block 100; perform mounting to the substrates 200 on the mounting blocks parallelly; and carrying the substrate 200 to which mounting has been performed from the product discharge block 80 to the product storage block 90 using the substrate carrying robot 82 and the substrate bypass carrying block 100. In this case, it is possible to efficiently perform mounting to small substrates with a single the flip chip mounting apparatus 500.

Figure 9:
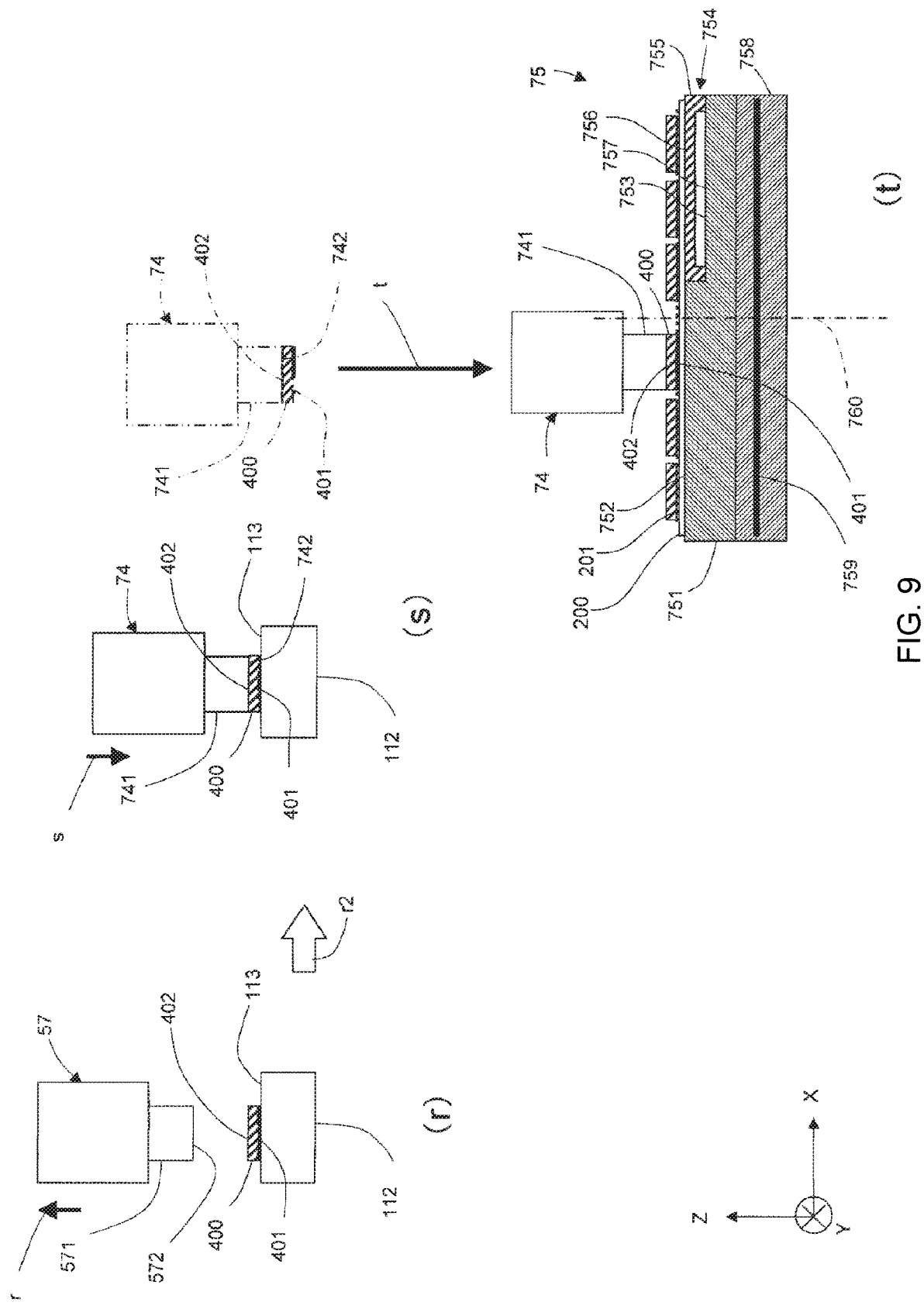
FIG. 9 is a view illustrating a downstream mounting step in the mounting process using the flip chip mounting apparatus according to the embodiment of the present invention.
Figure 10:
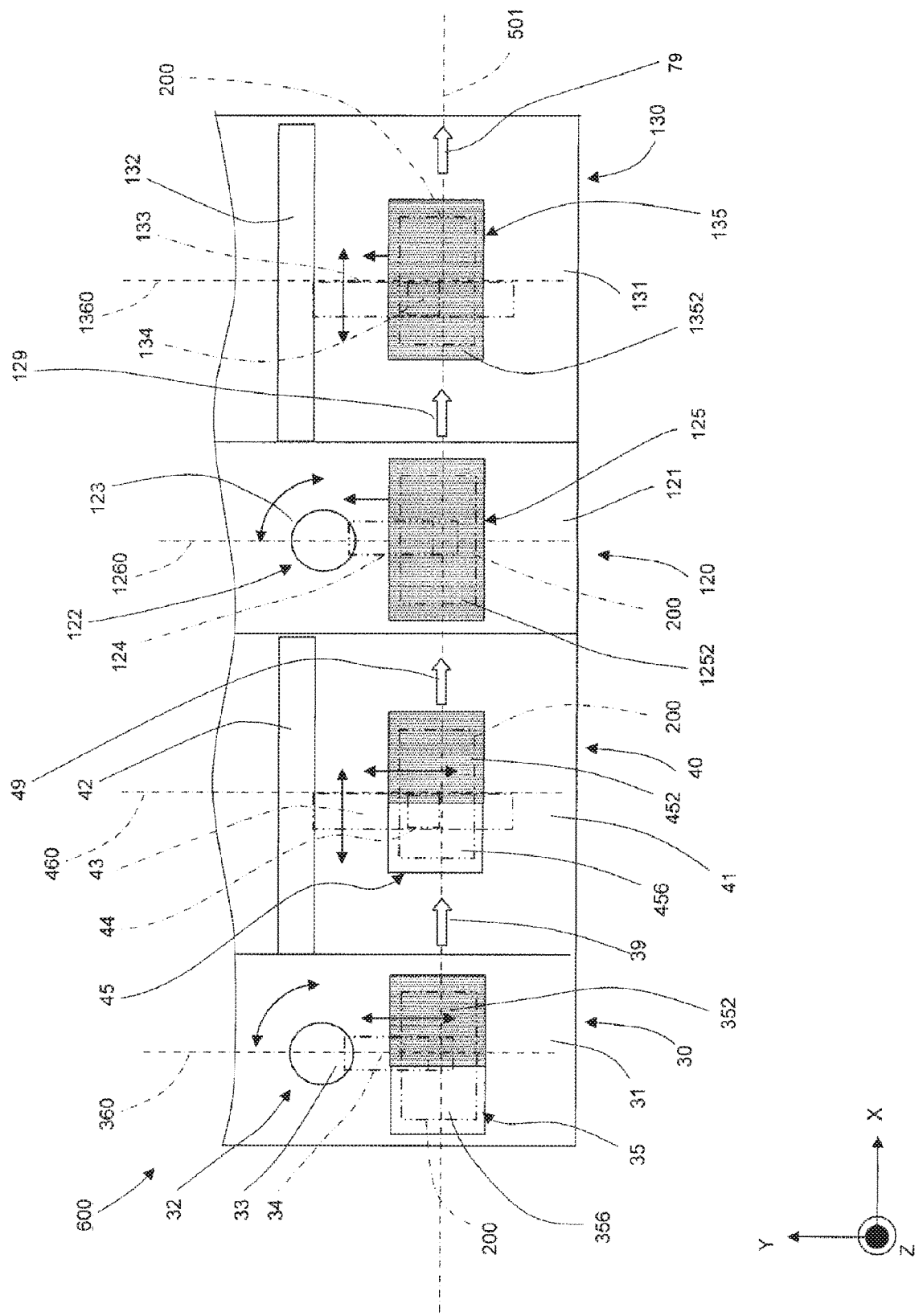
FIG. 10 is a plan view illustrating arrangement of mounting stages of a flip chip mounting apparatus according to a different embodiment of the present invention.

Hereinafter, a flip chip mounting apparatus 600 according to a different embodiment of the present invention will be described with reference to FIG. 10 through FIG. 13. Like components of the components in the embodiment described with reference to FIG. 1 through FIG. 9 are denoted by like reference numerals, and a description for such a component is omitted. As illustrated in FIG. 10, in this embodiment, downstream pre-heating stage 125 of a downstream pre-heating block 120 and a downstream mounting stage 135 of a downstream mounting block 130 are configured as full heating stages having no non-heating section. The downstream pre-heating block 120 includes a frame 121, a substrate carrying robot 122 attached to the frame 121, and the downstream pre-heating stage 125. The substrate carrying robot 122 includes a rotatably main body 123, and an extensible arm 124 attached to the main body 123. The downstream mounting block 130 includes a frame 131, an X-direction frame 132 attached to the frame 131, a Y-direction frame 133 attached to the X-direction frame 132, a downstream mounting head 134 attached to the Y-direction frame 133, and the downstream mounting stage 135 on which the substrate 200 is suctioned and fixed. Further, the substrate 200 is carried sequentially to the downstream pre-heating block 120 and the downstream mounting block 130, as indicated by white arrows 49 and 129.

Figure 11:
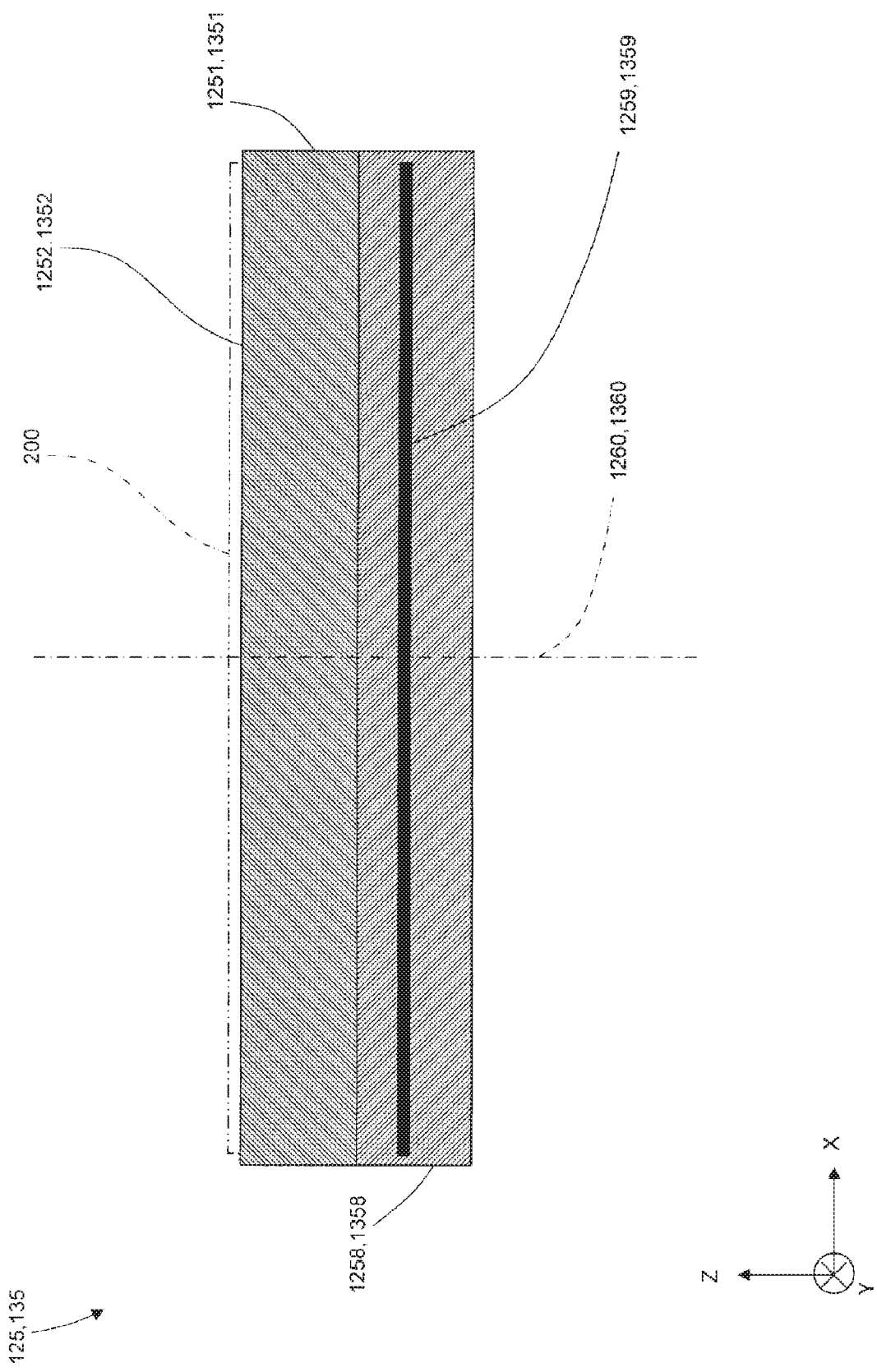
FIG. 11 is a sectional view of a downstream pre-heating stage and a downstream mounting stage of the flip chip mounting apparatus according to the different embodiment of the present invention.

As illustrated in FIG. 10, entire front surfaces of the downstream pre-heating stage 125 and the downstream mounting stage 135 in this embodiment constitute heating sections 1252 and 1352, respectively. As illustrated in FIG. 11, each of the stages 125 and 135 is configured such that a flat-plated metallic base body 1251, 1351 made of stainless steel or the like and a heater base 1258, 1358 having a heater 1259, 1359 built-in and laid under the base body are combined by a fastening member such as a bolt. Heat from the heaters 1259 and 1359 is transmitted to the base bodies 1251 and 1351 to increase the temperature of the heating sections 1252 and 1352 at the front surface that suctions the substrate 200.

A process for mounting the chips 400 on the substrate 200 using the flip chip mounting apparatus 600 according to this embodiment will be described with reference to FIG. 12 and FIG. 13. A step of applying the NCP (non-conductive paste) 201 to the substrate 200 by the dispenser 241, a step of heating a downstream region of the substrate that is substantially half of the substrate 200 by the upstream pre-heating stage 35 up to about 70 degrees Celsius, and transferring and placing the substrate to and on the upstream mounting stage 45, a step of picking the chip 400 up from the wafer 300, flipping the chip, placing the chip on the transfer stage 112, and carrying the chip to the upstream mounting block 40, and a step of mounting the chip 400 on the upstream mounting stage 45 are the same as those in the embodiment described with reference to FIG. 5 through FIG. 7 (paste application step, first suction (fixing) step, first heating step, and first mounting step).

Figure 12:
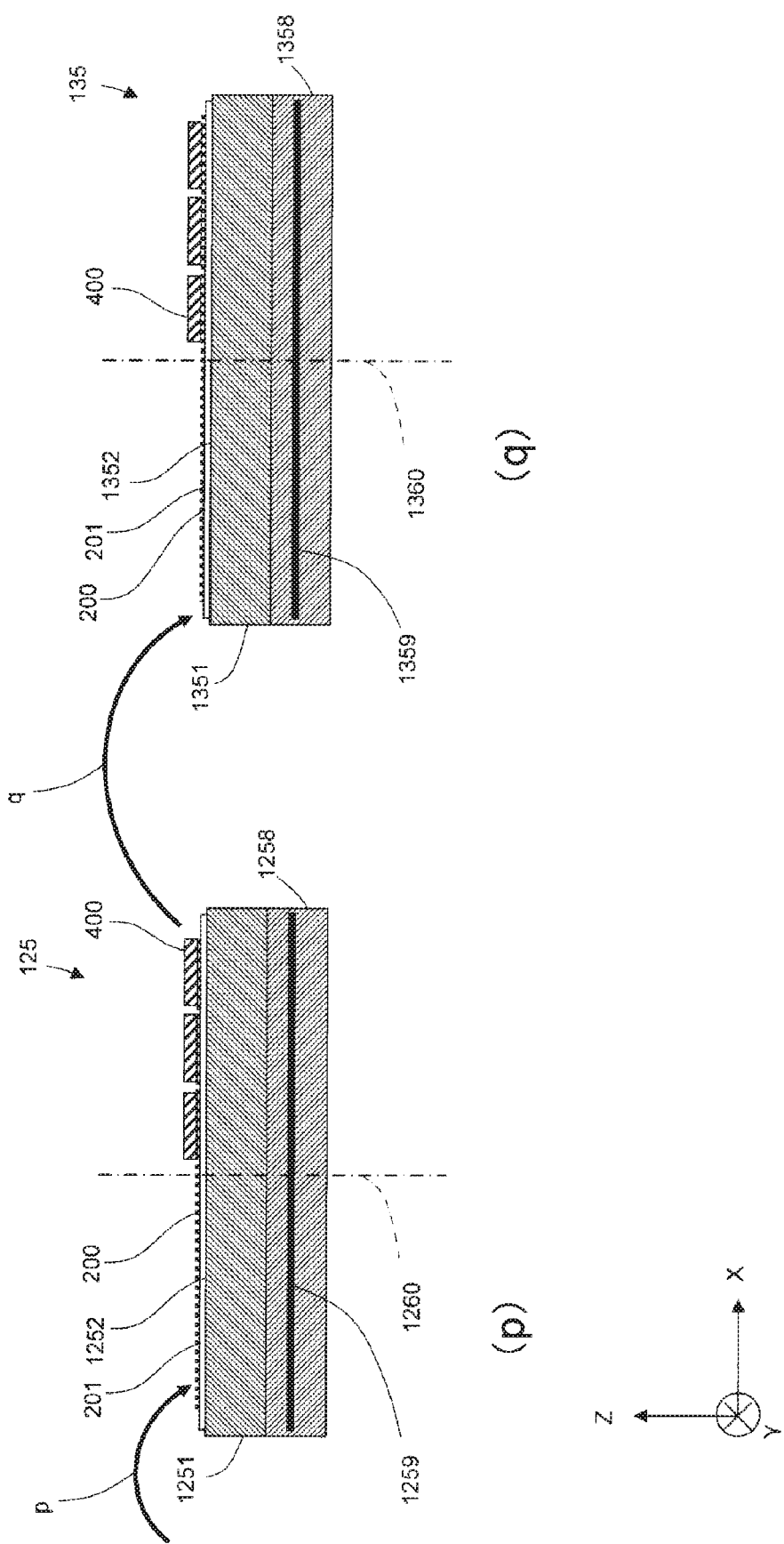
FIG. 12 is a view illustrating a downstream pre-heating step and a transfer step of transferring to the downstream mounting stage in the mounting process using the flip chip mounting apparatus according to the different embodiment of the present invention.
Figure 13:
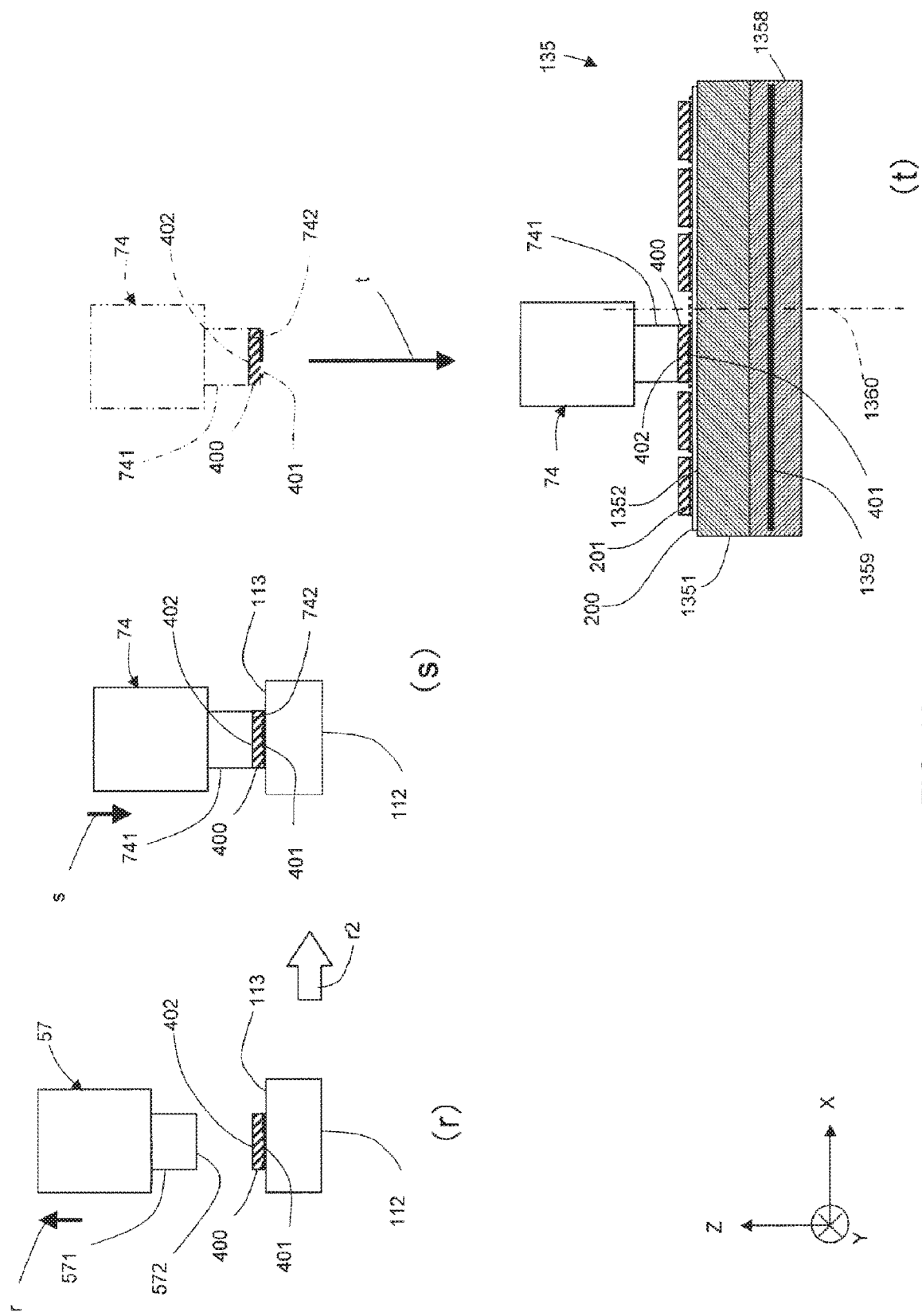
FIG. 13 is a view illustrating a downstream mounting step in the mounting process using the flip chip mounting apparatus according to the different embodiment of the present invention.

As illustrated in FIG. 10 and FIG. 12(*p*), the substrate 200 is picked up from the upstream mounting stage 45 by the substrate carrying robot 62 illustrated in FIG. 1, carried to the downstream pre-heating stage 125 as indicated by an arrow p in FIG. 12(*p*), and placed on the downstream mounting stage 135. The downstream mounting stage 135 suctions and fixes the substrate 200 onto its front surface. The downstream pre-heating stage 125 is configured as a full heating pre-heating stage whose entire front surface constitutes the heating section 1252, and the substrate 200 as a whole suctioned and fixed to the front surface (the heating section 1252) is heated up to around 70 degrees Celsius by the heater 1259. With this, as described with reference to FIG. 5 through FIG. 7, the temperature of the part of the substrate 200 at which the chips 400 are not mounted on the upstream mounting stage 45, or the part of the substrate 200 that has been suctioned and fixed to the non-heating section 456 of the upstream mounting stage 45 (the upstream region slightly smaller than the half of the substrate 200), is heated up to around 70 degrees Celsius from ordinary temperature or the temperature slightly higher than ordinary temperature. The temperature of the NCP (non-conductive paste) 201 applied to this region of the substrate 200 also increases up to around 70 degrees Celsius. Further, the temperature of the part of the substrate 200 at which the chips 400 have been mounted on the upstream mounting stage 45, or the part of the substrate 200 that has been suctioned and fixed to the heating section 452 of the upstream mounting stage 45 (the downstream region slightly greater than the half of the substrate 200), is maintained at the temperature around 70 degrees Celsius.

Then, when the temperature of the substrate 200 as a whole suctioned to the front surface of the downstream pre-heating stage 125 becomes about 70 degrees Celsius, the substrate 200 is picked up from the downstream pre-heating stage 125 by the substrate carrying robot 62 illustrated in FIG. 1, carried above and placed on the downstream mounting stage 135 as indicated by an arrow q in FIG. 12(*p*) and FIG. 12(*q*). The downstream mounting stage 135 suctions and fixes the substrate 200 onto its front surface (third suction (fixing) step).

Similarly to the downstream pre-heating stage 125, the downstream mounting stage 135 is configured as a full heating mounting stage for heating the substrate 200 as a whole, and the substrate 200 as a whole suctioned and fixed to the front surface as the heating section 1352 is maintained at the temperature around 70 degrees Celsius (third heating step).

Figure 6:
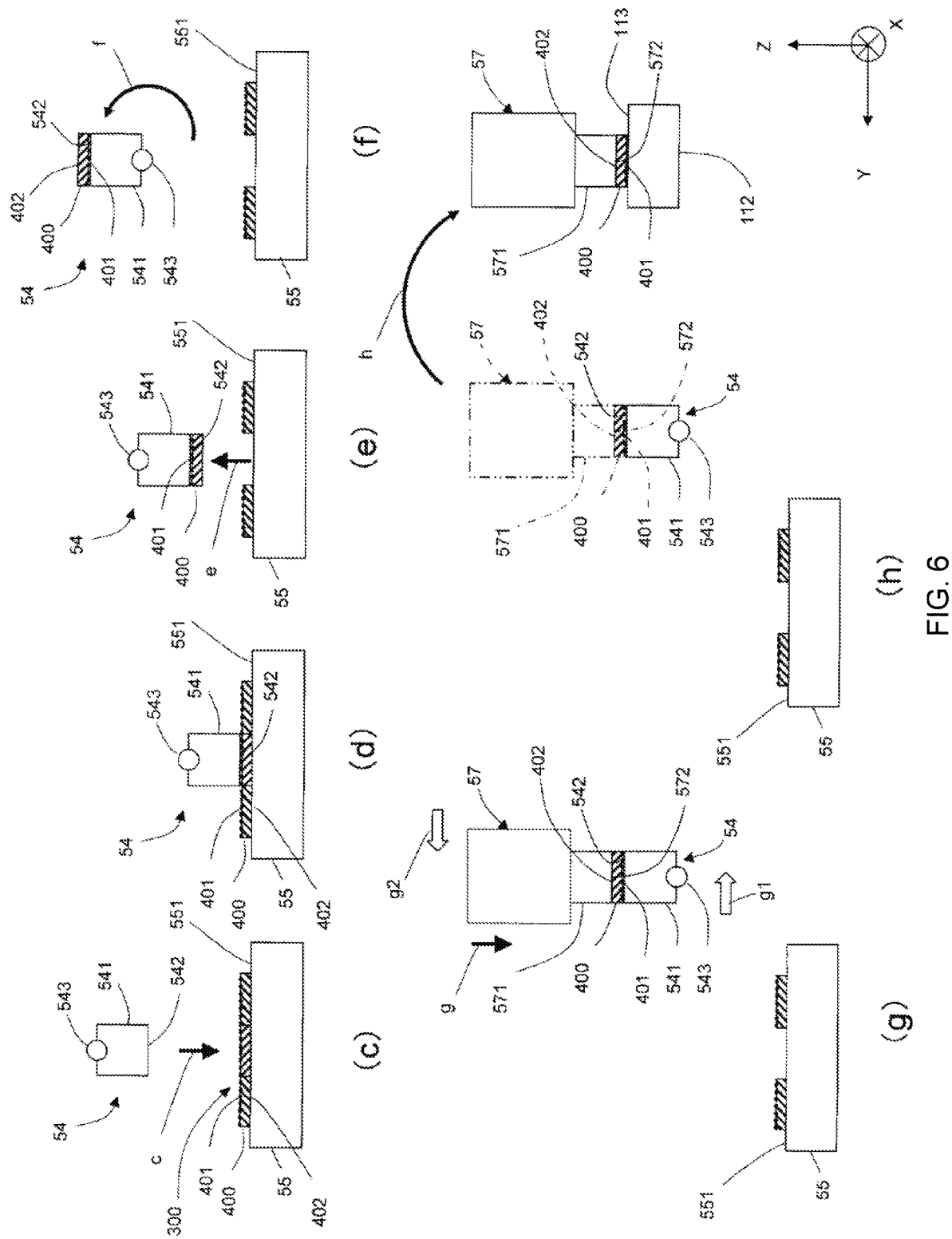
FIG. 6 is a view illustrating steps from picking up of a chip to flipping and placing of the chip on a transfer stage in the mounting process using the flip chip mounting apparatus according to the embodiment of the present invention.
Figure 7:
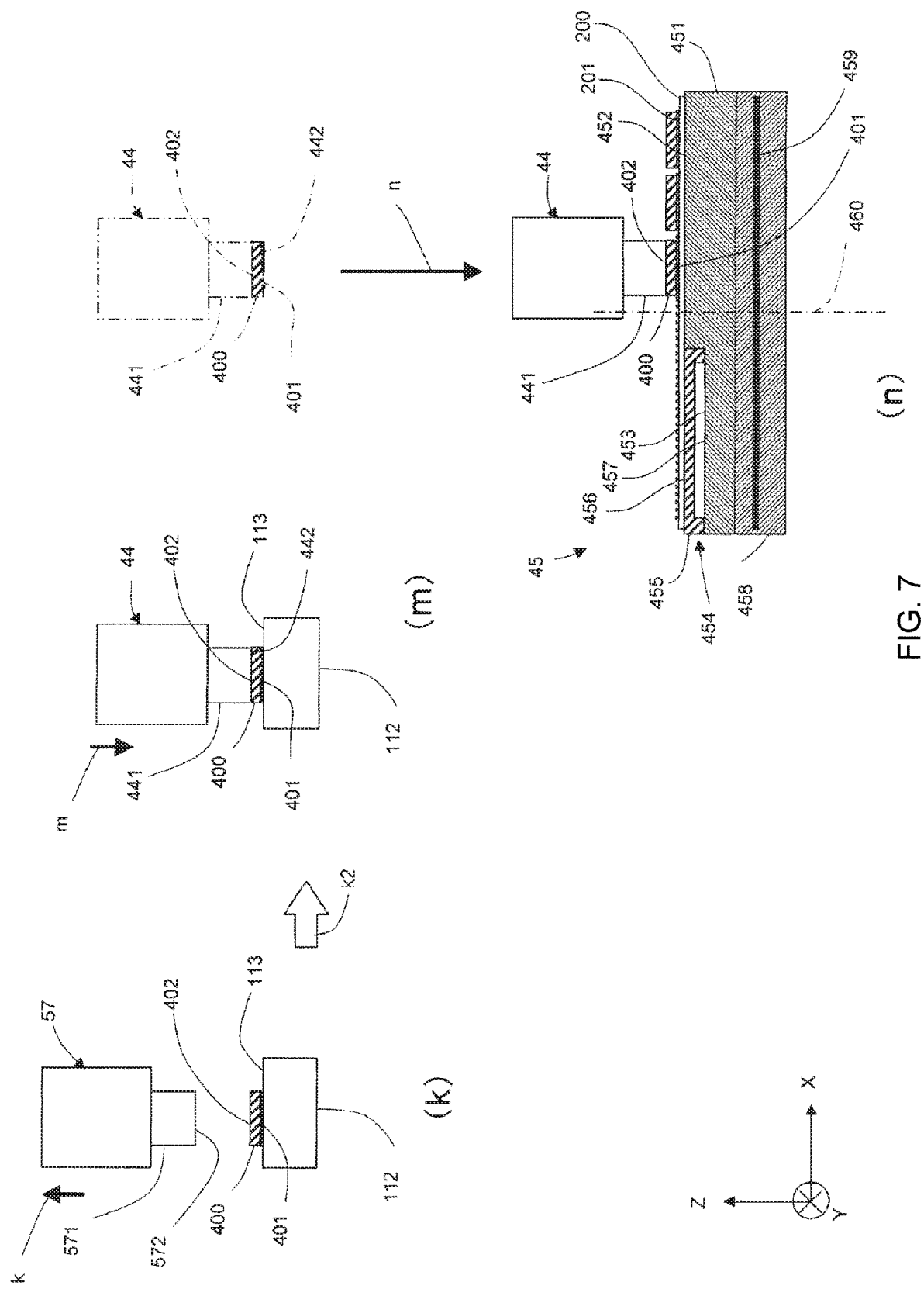
FIG. 7 is a view illustrating an upstream mounting step in the mounting process using the flip chip mounting apparatus according to the embodiment of the present invention.
Figure 8:
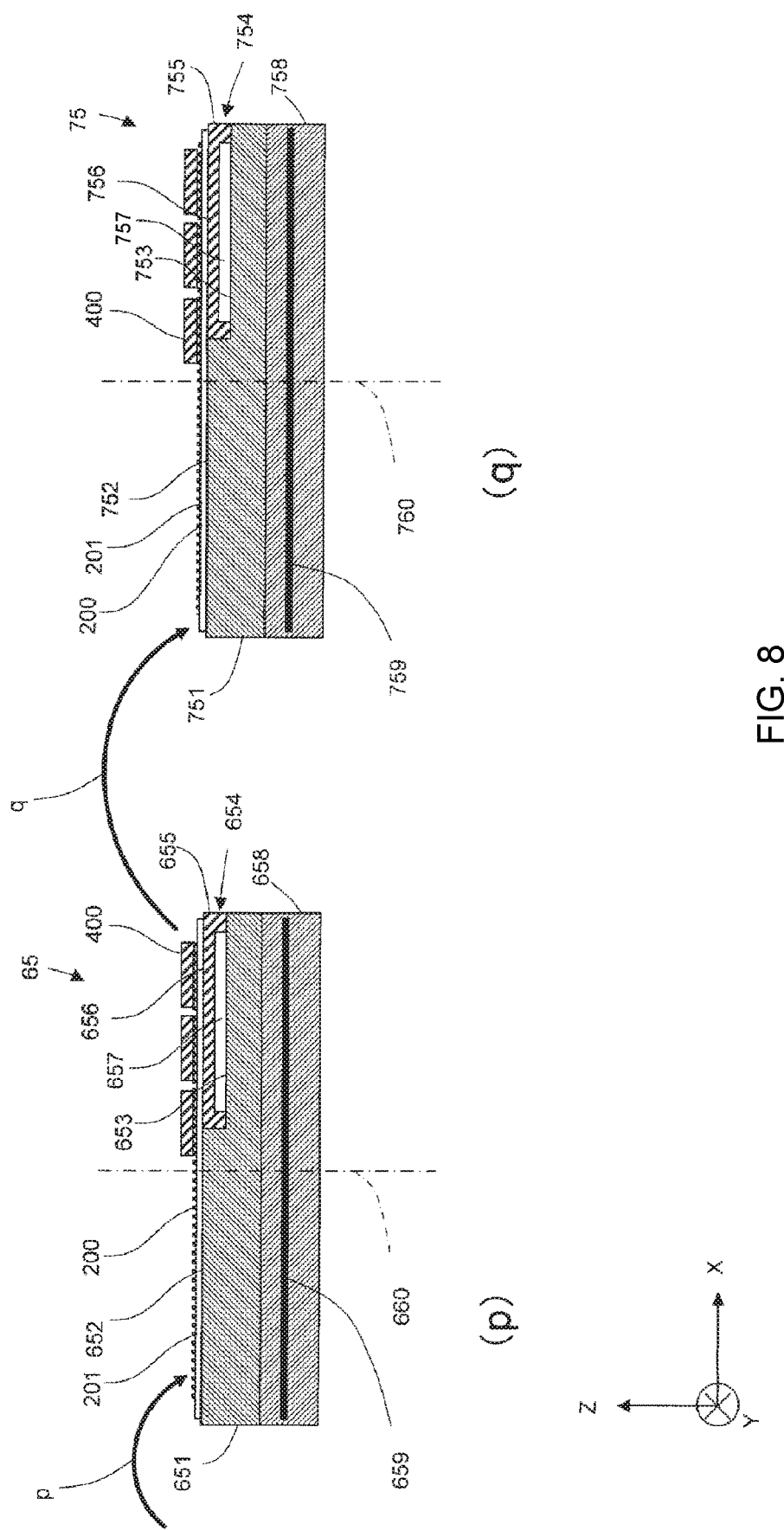
FIG. 8 is a view illustrating a downstream pre-heating step and a transfer step of transferring to the downstream mounting stage in the mounting process using the flip chip mounting apparatus according to the embodiment of the present invention.

As previously described with reference to FIG. 6(*c*) through FIG. 7(*k*), the chip 400 on the upper surface 551 of the pick up stage 55 is picked up by the pick up collet 541, flipped by 180 degrees, transferred to the transfer collet 571, and further transferred from the transfer collet 571 to the transfer stage 112. After transferring the chip 400 to the front surface 113 of the transfer stage 112, the transfer head 57 moves upward away from the chip 400 as indicated by an arrow r in FIG. 13(r). Then, the transfer stage 112 that has received the chip 400 is carried from the chip pick-up block 50 illustrated in FIG. 1 to the downstream mounting block 130 along the carrier path 111 of the chip carrying block 110 as indicated by a white arrow r2 in FIG. 13(r) and FIG. 13(s). In addition, as indicated by the arrows in FIG. 13(s), the downstream mounting tool 741 moves down to the transfer stage 112.

As indicated by an arrow s in FIG. 13(s), when the transfer stage 112 is carried to the downstream mounting block 130, the downstream mounting head 74 moves the downstream mounting tool 741 down above the transfer stage 112, brings the suction surface 742 of the downstream mounting tool 741 in contact with the front surface 402 of the chip 400, and causes the suction surface 742 of the downstream mounting tool 741 to suction the chip 400. Upon suctioning of the chip 400 to the suction surface 742, the downstream mounting tool 741 heats the chip 400 up to about 300 degrees Celsius using a heater (not shown) provided in the tool, and mounts the chip 400 at a predetermined position in the upstream region of the substrate that is substantially half of the substrate 200 suctioned and fixed to the downstream mounting stage 135 as indicated by an arrow t in FIG. 13(t). As the temperature of the substrate 200 suctioned and fixed to the front surface that is the heating section 1352 of the downstream mounting stage 135 and the NCP (non-conductive paste) 201 applied to the substrate 200 is about 70 degrees Celsius, when the chip 400 that has been heated up to around 300 degrees Celsius is mounted, the bumps 401 formed on the mounting surface of the chip 400 are melted and joined to the electrodes on the substrate 200, the NCP (non-conductive paste) 201 is heated and cured, and the chip 400 is fixed and mounted on the substrate 200 (third mounting step).

In the third mounting step, as previously described with reference to FIG. 9(t), mounting of the chips 400 to the substrate 200 is performed, along a line on a rightmost side (in positive X direction) in the heating section 1352 of the downstream mounting stage 135 illustrated in FIG. 13(t), from the back side (in positive Y direction) in the figure to the front side (in negative Y direction) in the figure. Upon completion of mounting of the chips 400 along this line, the downstream mounting stage 135 is moved by an amount of one chip in the positive X direction by the XY table that is not shown, and mounting of the chips 400 is performed along a next line. Thereafter, upon completion of mounting of the chips 400 along every single line, the downstream mounting stage 135 is moved by an amount of one chip in the positive X direction by the XY table that is not shown, and mounting of the chips 400 along a next line is performed. Then, when the chips 400 are mounted to all of the predetermined positions on the substrate 200 suctioned and fixed to the heating section 1352 of the downstream mounting stage 135, the third mounting step on the downstream mounting stage 135 is terminated.

Upon completion of mounting of the chips 400 to the predetermined positions in the part of the substrate 200 suctioned and fixed to the heating section 1352 of the downstream mounting stage 135, the substrate 200 is carried to a curing apparatus that is not shown, and is subjected to curing for about an hour at temperature around 200 degrees Celsius, for example. With this, the NCP (non-conductive paste) 201 is fully cured.

Similarly to the flip chip mounting apparatus 500 according to the embodiment described with reference to FIG. 1 through FIG. 9, according to the flip chip mounting apparatus 600 in this embodiment, it is possible to maintain the upstream half of the substrate 200 at ordinary temperature or at temperature slightly higher than ordinary temperature during mounting of the chips 400 to the downstream half of the substrate 200, and to suppress transformation of the NCP (non-conductive paste) 201 due to heat before mounting of the chips to the upstream half of the substrate 200. Therefore, as the number of the chips 400 that can be mounted before the NCP (non-conductive paste) 201 applied to the substrate 200 transforms due to heat is twice as large as that in the conventional flip chip mounting apparatus, it is possible to provide the same effect of allowing to mount a large number of chips 400 on the substrate 200, while suppressing transformation of the NCP (non-conductive paste) 201 due to heat.

Further, according to the flip chip mounting apparatus 600 in this embodiment, unlike the flip chip mounting apparatus 500 according to the embodiment previously described with reference to FIG. 1 though FIG. 9 in which the time period after application of the NCP (non-conductive paste) 201 to the substrate 200 until mounting of all the chips 400 on the downstream mounting stage 75 is completed is substantially identical to a time period during which the NCP (non-conductive paste) 201 applied to the substrate 200 is heated at around 70 degrees Celsius, a time period during which the NCP (non-conductive paste) 201 applied to the downstream half of the substrate 200 is heated at around 70 degrees Celsius is twice as long as a time period during which the NCP (non-conductive paste) 201 applied to the upstream half of the substrate 200 is heated at around 70 degrees Celsius. However, as the NCP (non-conductive paste) 201 applied to the upstream half of the substrate 200 has already been cured during the mounting on the upstream mounting stage 45, its state in curing is often not largely influenced even if the temperature around 70 degrees Celsius is maintained. In such a case, the flip chip mounting apparatus 600 according to this embodiment having a simpler configuration provides a greater advantage than the flip chip mounting apparatus 500 does.

Figures 14A, 14B:
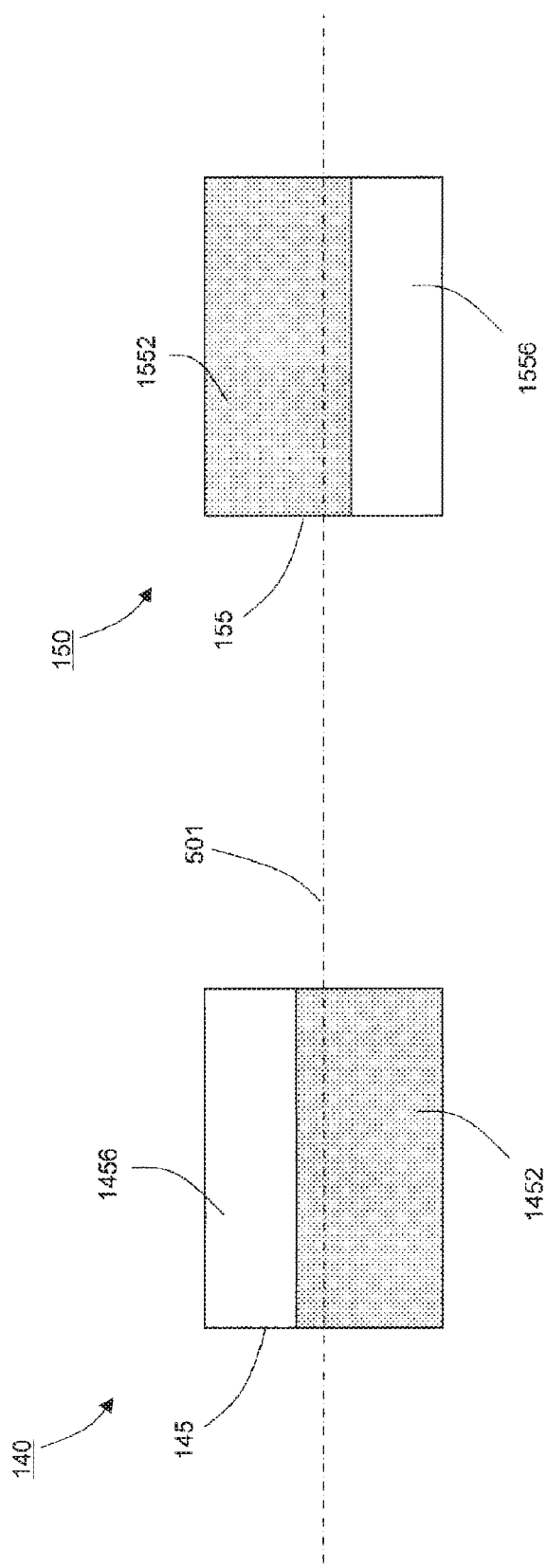
FIG. 14A is a plan view illustrating a configuration of a mounting stage of the flip chip mounting apparatus according to a different embodiment of the present invention.
FIG. 14B is a plan view illustrating a configuration of the mounting stage of the flip chip mounting apparatus according to the different embodiment of the present invention.

Next, a different embodiment of the present invention will be described with reference to FIG. 14A and FIG. 14B. In the embodiment described with reference to FIG. 1 through FIG. 9, the heating sections and the non-heating sections of the first type sectionalized stage, the first type sectionalized mounting stage, the second type sectionalized stage, and the second type sectionalized mounting stage are divided into sections on the upstream side and the downstream side of the substrate 200 in the carrying direction (X direction). As illustrated in FIG. 14A and FIG. 14B, however, heating sections 1452 and 1552 and non-heating sections 1456 and 1556 respectively of an upstream mounting stage 145 of an upstream mounting block 140 and a downstream mounting stage 155 of a downstream mounting block 150 can be defined by dividing surfaces of the respective stages into upside and downside sections with respect to a direction perpendicular to the carrying direction of the substrate 200 (Y direction). An effect of this embodiment is the same as that of the embodiment described with reference to FIG. 1 through FIG. 9.

Further, as illustrated in FIG. 15A, FIG. 15B, and FIG. 15C, it is possible to configure such that sectionalized mounting stages 165, 175, and 185 are provided for three mounting blocks 160, 170, and 180, respectively, about ⅓ of each of the mounting stages 165, 175, and 185 is defined as corresponding one of heating sections 1652, 1752, and 1852, about ⅔ of each stage is defined as corresponding one of non-heating sections 1656, 1756, and 1856, and the heating sections are arranged in a displaced manner with respect to each other by ⅓ of the length of the stages in the X direction as illustrated in FIG. 15A, FIG. 15B, and FIG. 15C. This embodiment provides an effect of allowing to mount a larger number of chips 400 on the substrate 200 than in the embodiment described with reference to FIG. 1 through FIG. 9, while suppressing transformation of the NCP (non-conductive paste) 201 due to heat.

Figure 16:
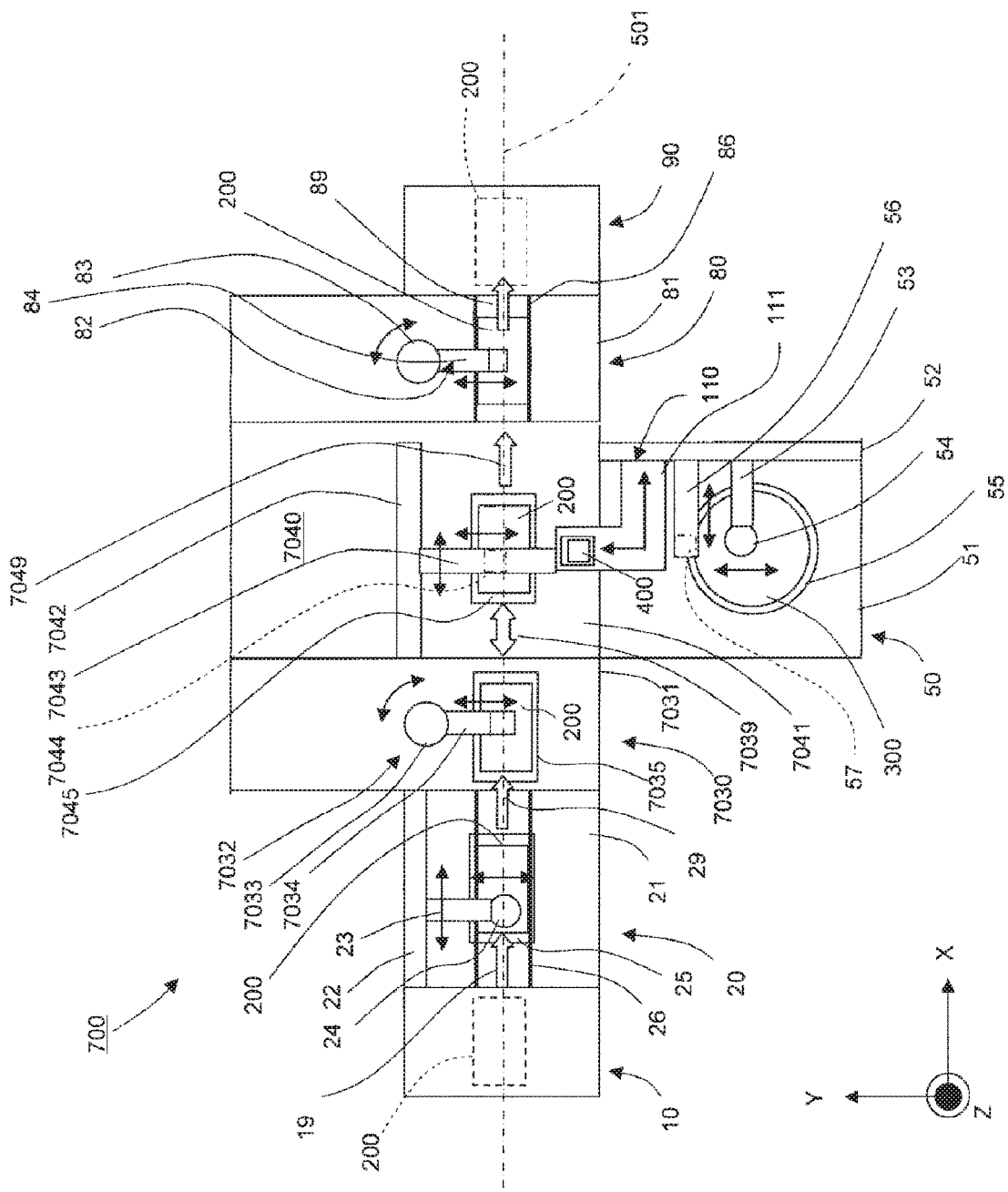
FIG. 16 is a plan view illustrating a configuration of a flip chip mounting apparatus according to a different embodiment of the present invention.

Hereinafter, a different embodiment of the present invention will be described with reference to FIG. 16 through FIG. 20. Like components of the components in the embodiment previously described with reference to FIG. 1 through FIG. 9 are denoted by like reference numerals, and a description for such a component is omitted. A flip chip mounting apparatus 700 according to this embodiment includes only one pre-heating block and one mounting block. As illustrated in FIG. 16, the flip chip mounting apparatus 700 of this embodiment includes the substrate supply block 10, the NCP (non-conductive paste) application block 20, a pre-heating block 7030, a mounting block 7040, the product discharge block 80, the product storage block 90, the chip pick-up block 50, and the chip carrying block 110. The mounting block 7040 includes a frame 7041, an X-direction frame 7042 attached to the frame 7041, a Y-direction frame 7043 attached to the X-direction frame 7042, a mounting head 7044 attached to the Y-direction frame 7043, a mounting stage 7045 on which the substrate 200 is suctioned and fixed. The substrate 200 is carried from the substrate supply block 10 toward the NCP (non-conductive paste) application block 20, the pre-heating block 7030, and the mounting block 7040 as indicated by white arrows 19, 29, and 7039. After chips 400 are mounted to a downstream half of the substrate 200 in the mounting block 7040, the substrate 200 is rotated by a substrate carrying robot 7032 attached to a frame 7031 by 180 degrees within a horizontal plane, carried back to the pre-heating block 7030, again carried from the pre-heating block 7030 toward the mounting block 7040 as indicated by a white arrow 7039, and then carried to the product storage block 90 through the product discharge block 80 as indicated by white arrows 7049 and 89.

Figure 17:
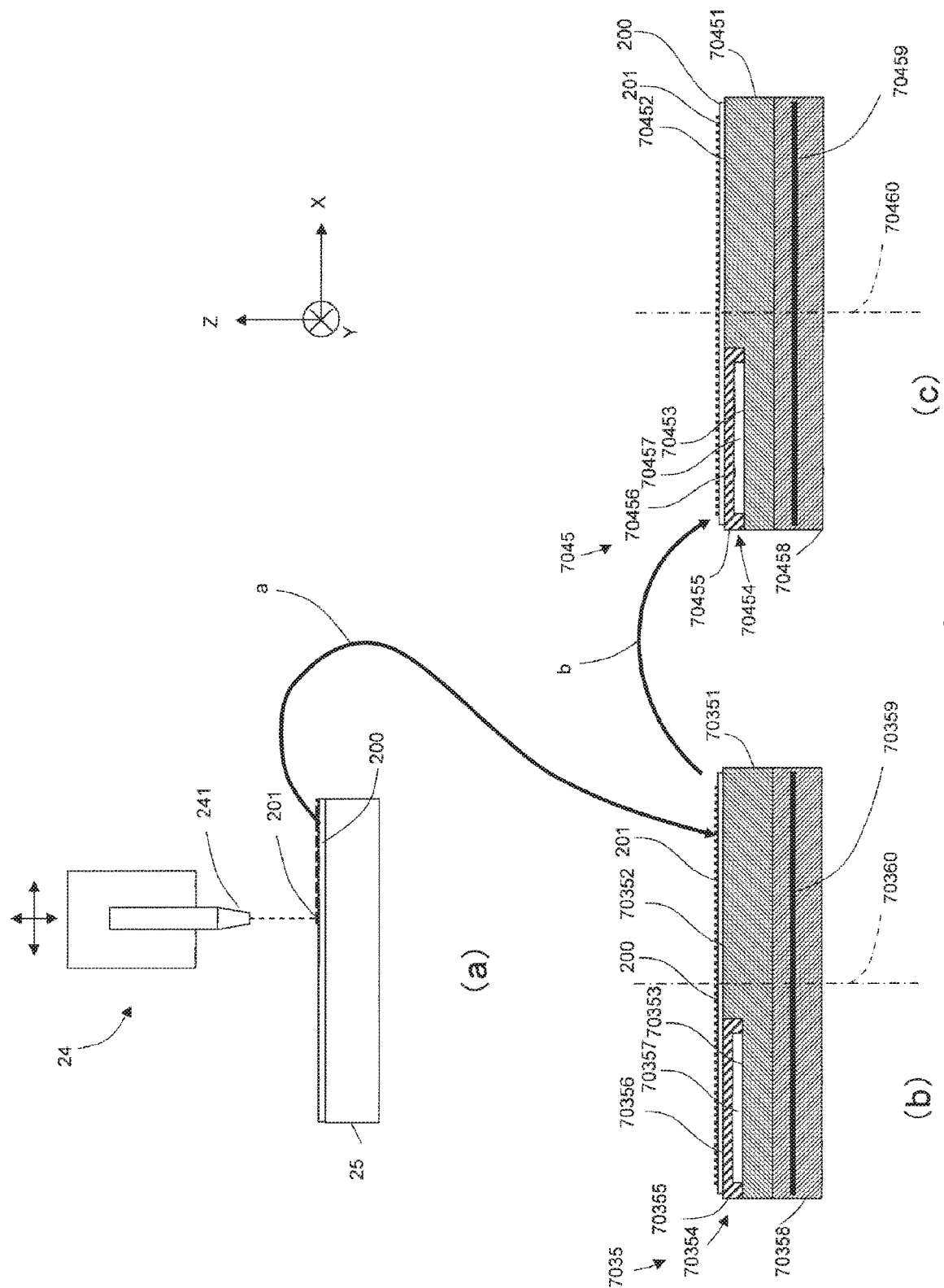
FIG. 17 is a view illustrating an NCP application step, a pre-heating step, and a transfer step of transferring to the mounting stage in a mounting step using the flip chip mounting apparatus according to the different embodiment of the present invention.

As illustrated in FIG. 17(*b*) and FIG. 17(*c*), similarly to the upstream pre-heating stage 35 and the upstream mounting stage 45 previously described with reference to FIG. 2, a pre-heating stage 7035 and the mounting stage 7045 are sectionalized mounting stages, each divided into corresponding one of heating sections 70352 and 70452 and corresponding one of non-heating sections 70356 and 70456. The heating sections 70352 and 70452 are for heating the substrate 200 suctioned to front surfaces of the respective sections, and the non-heating sections 70356 and 70456 are not heating the substrate 200 suctioned to front surfaces of the respective sections. The heating sections 70352 and 70452 are slightly wider than the non-heating sections 70356 and 70456, and respectively extend beyond central lines 70360 and 70460 in Y direction of the respective stages. The pre-heating stage 7035 and the mounting stage 7045 are a first type sectionalized stage and a first type sectionalized mounting stage divided into the heating sections 70352 and 70452 and the non-heating sections 70356 and 70456, respectively. The heating sections 70352 and 70452 are arranged in downstream of the carrying direction of the substrate 200, and the non-heating sections 70356 and 70456 are arranged in upstream of the carrying direction of the substrate 200.

As illustrated in FIG. 17(*b*), FIG. 17(*c*), similarly to the upstream pre-heating stage 35 and the upstream mounting stage 45 described with reference to FIG. 3, the pre-heating stage 7035 includes a planar base body 70351, a heat insulating layer 70354, and a heater base 70358, and the mounting stage 7045 includes a planar base body 70451, a heat insulating layer 70454, and a heater base 70458. The planar base bodies 70351 and 70451 respectively have planar stepped portions 70353 and 70453 in the upstream of the carrying direction of the substrate 200, the heat insulating layers 70354 and 70454 are laid respectively over the stepped portions 70353 and 70453, and the heater bases 70358 and 70458 are laid respectively under the base bodies 70351 and 70451. The base bodies 70351 and 70451 are made of a highly thermally-conductive metal such as stainless steel, for example, and the heat insulating layers 70354 and 70454 are respectively include heat insulating spacers 70355 and 70455 made of a material with low thermal conductivity such as a plastic, for example. The heat insulating spacers 70355 and 70455 respectively include depressed portions 70357 and 70457 on surfaces on a side of the stepped portions 70353 and 70453 to form heat insulating layers of air between the heat insulating spacers 70355 and 70455 and front surfaces of the stepped portions 70353 and 70453, and thus provide effective thermal insulation from the front surfaces of the stepped portions 70353 and 70453. Further, the heater base 70358 includes heaters 70359 and 70459 positioned therein. Front surfaces of the base bodies 70351 and 70451 respectively correspond to the heating sections 70352 and 70452, and front surfaces of the heat insulating spacers 70355 and 70455 respectively correspond to the non-heating sections 70356 and 70456.

A process for mounting the chips 400 on the substrate 200 using the flip chip mounting apparatus 700 thus configured will be described with reference to FIG. 17 through FIG. 20.

The NCP application block 20 illustrated in FIG. 16 suctions and fixes the substrate 200 carried from the substrate supply block 10 onto the dispenser stage 25, and applies an NCP (non-conductive paste) 201, using the dispenser 241, to a plurality of positions on the substrate 200 at which chips 400 are to be mounted while moving the dispenser head 24 in XYZ direction as illustrated in FIG. 17(*a*). The application of the NCP (non-conductive paste) 201 is performed while the substrate 200 is at ordinary temperature (paste application step).

Upon application of the NCP (non-conductive paste) 201 to the predetermined positions on the substrate 200, the substrate 200 is picked up from the dispenser stage 25 by the substrate carrying robot 7032 illustrated in FIG. 16, carried to the pre-heating stage 7035 as indicated by an arrow a in FIG. 17(*a*) and FIG. 17(*b*), and placed on the pre-heating stage 7035. The pre-heating stage 7035 suctions and fixes the substrate 200 on its front surface. As illustrated in FIG. 17(*b*), the pre-heating stage 7035 is the first type sectionalized stage divided into a heating section 70352 arranged in the downstream of the carrying direction of the substrate 200 and a non-heating section 70356 arranged in the upstream of the carrying direction of the substrate 200. A downstream region of the substrate 200 in the carrying direction that is slightly greater than a half of the substrate 200 (a part suctioned and fixed to the heating section 70352) is heated up to around 70 degrees Celsius by the heater 70359. With this, the temperature of the NCP (non-conductive paste) 201 applied to this region of the substrate 200 also increases up to around 70 degrees Celsius. In contrast, an upstream region of the substrate 200 in the carrying direction that is slightly smaller than the half of the substrate 200 (a part suctioned and fixed to the non-heating section 70356) is not heated, as heat from the heater 70359 is blocked by the heat insulating layer 70354. Therefore, the temperature of this region is maintained at ordinary temperature or slightly higher than ordinary temperature. With this, the temperature of the NCP (non-conductive paste) 201 applied to this region of the substrate 200 is also maintained at ordinary temperature or slightly higher than ordinary temperature.

Then, when the temperature of the part of the substrate 200 suctioned and fixed to the heating section 70352 increases up to around 70 degrees Celsius, the substrate 200 is picked up from the pre-heating stage 7035 by the substrate carrying robot 7032 illustrated in FIG. 16, carried to the mounting stage 7045 as indicated by an arrow b in FIG. 17(*b*) and FIG. 17(*c*), and placed on the mounting stage 7045. The mounting stage 7045 suctions and fixes the substrate 200 on its front surface (first suction (fixing) step).

The mounting stage 7045 is the first type sectionalized stage divided into a heating section 70452 arranged in the downstream of the carrying direction of the substrate 200 and a non-heating section 70456 arranged in the upstream of the carrying direction of the substrate 200. The downstream region of the substrate 200 in the carrying direction that is slightly greater than the half of the substrate 200 (a part suctioned and fixed to the heating section 70452) is maintained at the temperature around 70 degrees Celsius by the heater 70459, and the temperature of the NCP (non-conductive paste) 201 applied to this region of the substrate 200 is also maintained at the temperature around 70 degrees Celsius. In the upstream region of the substrate 200 in the carrying direction that is slightly smaller than the half of the substrate 200 (a part suctioned and fixed to the non-heating section 70456), heat from the heater 70459 is blocked by the heat insulating layer 70454. Therefore, the temperature of this region is maintained at ordinary temperature or slightly higher than ordinary temperature. The temperature of the NCP (non-conductive paste) 201 applied to this region of the substrate 200 is also maintained at ordinary temperature or slightly higher than ordinary temperature (first heating step).

As previously described with reference to FIG. 6(*c*) through FIG. 7(*n*), the chip 400 is picked up from the pick up stage 55, inverted, and carried to the mounting block 7040 along the carrier path 111 of the chip carrying block 110 illustrated in FIG. 16.

Figure 18:
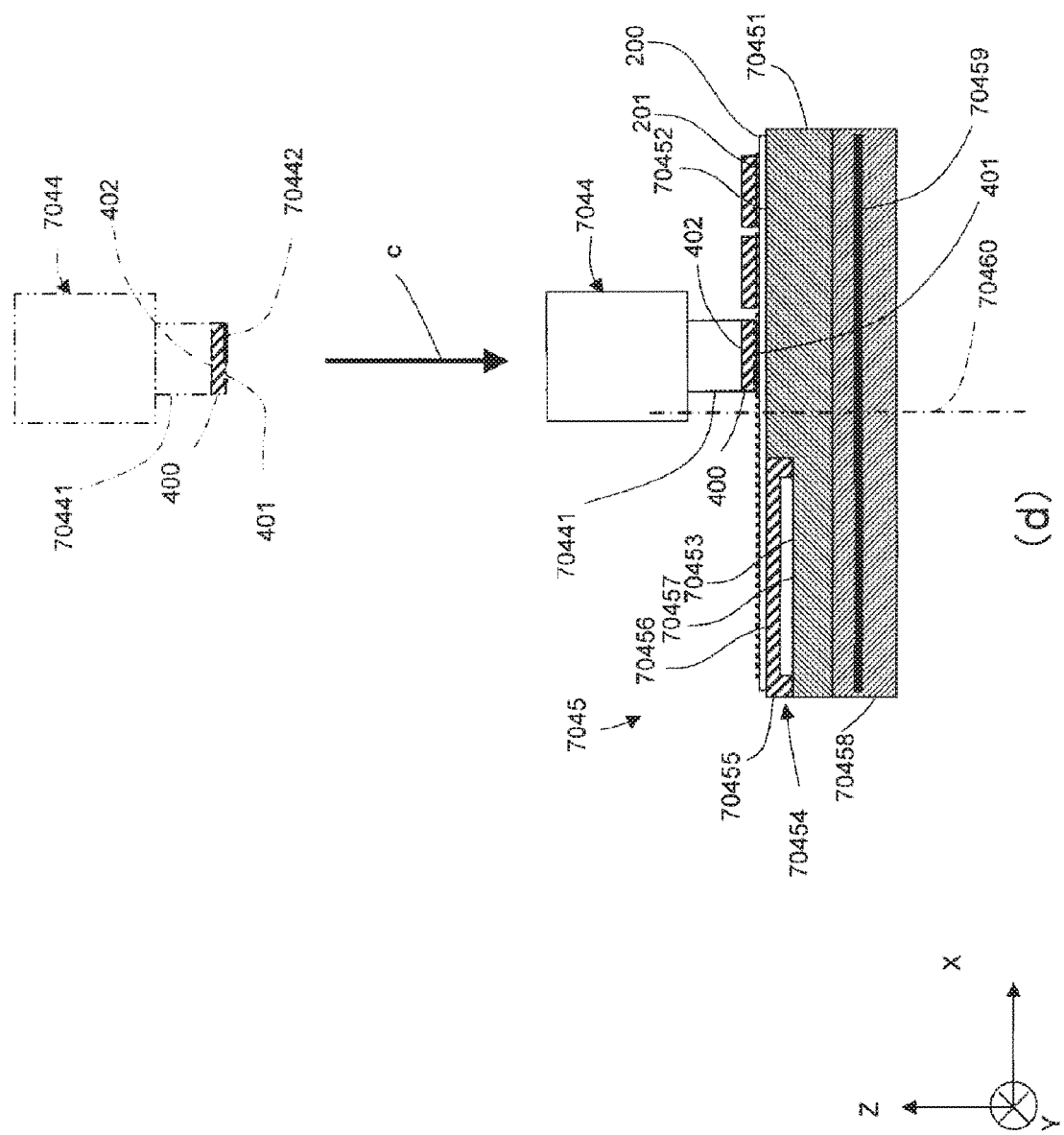
FIG. 18 is a view illustrating a mounting step in the mounting process using the flip chip mounting apparatus according to the different embodiment of the present invention.

As indicated by an alternate long and two short dashes line in FIG. 18(*d*), when the chip 400 that has been carried is suctioned to a suction surface 70442, a mounting tool 70441 heats the chip 400 up to about 300 degrees Celsius using a heater (not shown) provided in the tool, and mounts the chip 400 at a predetermined position on the substrate 200 suctioned and fixed to the heating section 70452 of the mounting stage 7045 as indicated by an arrow c in FIG. 18(*d*). As the temperature of the substrate 200 suctioned and fixed to the heating section 70452 and the NCP (non-conductive paste) 201 applied to this region of the substrate 200 is about 70 degrees Celsius, when the chip 400 that has been heated up to about 300 degrees Celsius is mounted, the bumps 401 formed on the mounting surface of the chip 400 are melted and joined to the electrodes on the substrate 200, the NCP (non-conductive paste) 201 is heated and cured, and the chip 400 is fixed and mounted on the substrate 200 (first mounting step).

In this first mounting step, mounting of the chips 400 to the substrate 200 is performed, along a line on a rightmost side (in positive X direction) in FIG. 18(*d*), from a back side (in positive Y direction) in the figure to a front side (in negative Y direction) in the figure. Upon completion of mounting of the chips 400 along the line on the rightmost side shown in FIG. 18(*d*), the mounting stage 7045 is moved by an amount of one chip in the positive X direction by the XY table that is not shown, and mounting of the chips 400 is performed along a line on a side next to the rightmost side. Thereafter, upon completion of mounting of the chips 400 along every single line, the mounting stage 7045 is moved by an amount of one chip in the positive X direction by the XY table that is not shown, and mounting of the chips 400 along a next line is performed. Then, when the chips 400 are mounted to all of the predetermined positions on the substrate 200 suctioned and fixed to the heating section 70452 of the mounting stage 7045, the first mounting step on the mounting stage 7045 is terminated.

At this time, as heat from the heater 459 to the part corresponding to the non-heating section 70456 of the mounting stage 7045 in the upstream of the carrying direction of the substrate 200 (X direction) is blocked by the heat insulating layer 454, the temperature of this part is maintained at ordinary temperature or slightly higher than ordinary temperature. Accordingly, the substrate 200 and the NCP (non-conductive paste) 201 applied to the substrate 200 are also maintained at ordinary temperature or the temperature slightly higher than ordinary temperature. Therefore, in the upstream region of the substrate 200 in the carrying direction that is slightly smaller than the half of the substrate 200 on the mounting stage 7045, the temperature of the NCP (non-conductive paste) 201 is maintained at ordinary temperature or slightly higher than ordinary temperature during mounting of the chips 400. Thus, it is possible to suppress transformation due to an increase of the temperature of the NCP (non-conductive paste) 201.

Upon completion of the first mounting step, the substrate carrying robot 7032 illustrated in FIG. 16 picks the substrate 200 up from the mounting stage 7045, and rotates the substrate 200 by 180 degrees within a horizontal plane (within an XY plane) such that an end on the downstream side (positive X direction side) is directed to the upstream side (negative X direction side). As a result, the chips 400 that have been mounted on the substrate 200 in the first mounting step are positioned in the upstream of the carrying direction. Then, as indicated by an arrow d in FIG. 19(*e*), the substrate carrying robot 7032 carries the substrate 200 back toward the pre-heating stage 7035, and places the substrate 200 on the pre-heating stage 7035 such that a portion in which the chips 400 have been mounted is in the upstream of the carrying direction (negative X direction side), and that a portion in which the chips 400 are not mounted is in the downstream of the carrying direction (positive X direction side). The pre-heating stage 7035 suctions and fixes the substrate 200 that has been placed (fourth suction (fixing) step).

Figure 19:
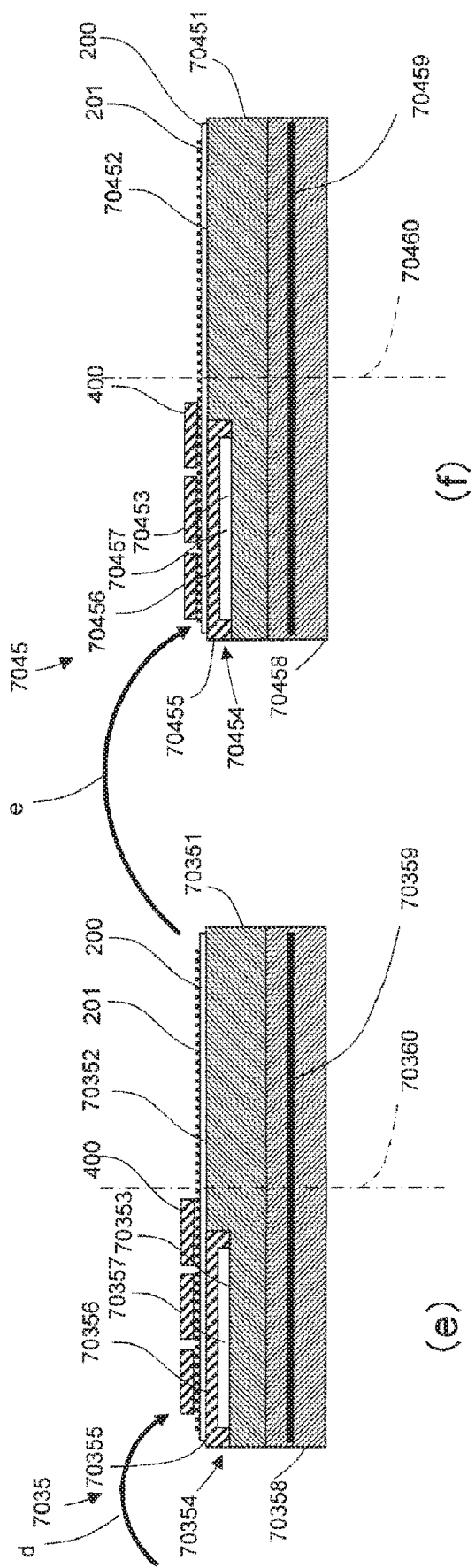
FIG. 19 is a view illustrating a pre-heating step and a transfer step of transferring to the mounting stage in the mounting process using the flip chip mounting apparatus according to the different embodiment of the present invention.
Figure 20:
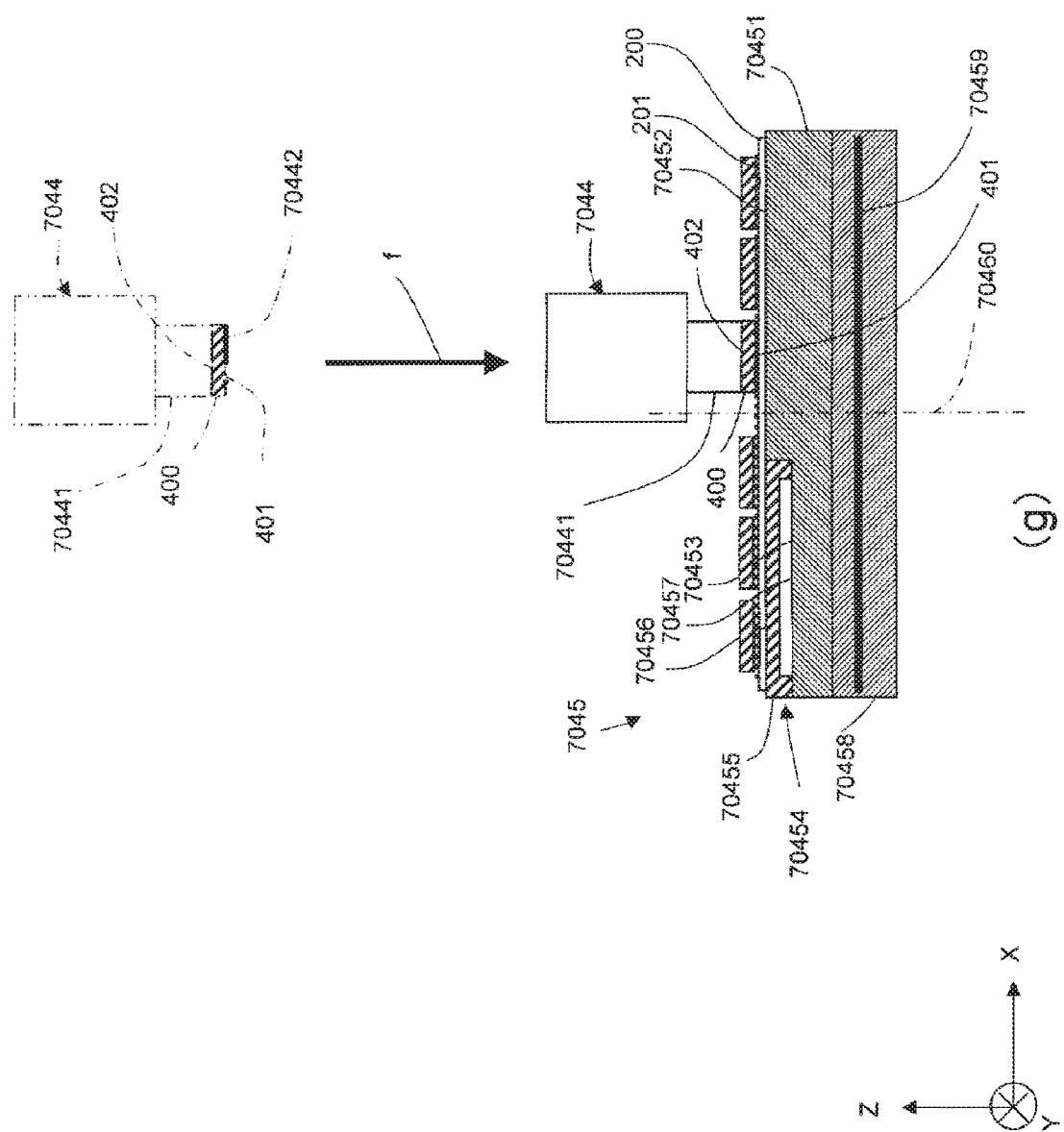
FIG. 20 is a view illustrating a mounting step in the mounting step process the flip chip mounting apparatus according to the different embodiment of the present invention.

As described previously, the pre-heating stage 7035 is the first type sectionalized stage divided into the heating section 70352 arranged in the downstream of the carrying direction of the substrate 200 and the non-heating section 70356 arranged in the upstream of the carrying direction of the substrate 200. The part of the substrate 200 in which the chips 400 are not mounted (the part suctioned and fixed to the heating section 70352) is heated up to around 70 degrees Celsius by the heater 70359. With this, as illustrated in FIG. 19(*e*), the temperature of the NCP (non-conductive paste) 201 applied to the substrate 200 of the part in which the chips 400 are not mounted also increases up to around 70 degrees Celsius. In contrast, the part in which the chips 400 have been mounted (the part suctioned and fixed to the non-heating section 70356) is not heated, as heat from the heater 70359 is blocked by the heat insulating layer 70354. Therefore, the temperature of this part is maintained at ordinary temperature or slightly higher than ordinary temperature. Therefore, the part in which the chips 400 have been mounted is not heated by the heater 70359, and its temperature gradually decreases (fourth heating step).

Then, when the temperature of the part of the substrate 200 in which the chips 400 are not mounted (the part suctioned and fixed to the heating section 70352) increases up to around 70 degrees Celsius, the substrate 200 is picked up from the pre-heating stage 7035 by the substrate carrying robot 7032 illustrated in FIG. 16, carried again to the mounting stage 7045 as indicated by an arrow e in FIG. 19(e) and FIG. 19(f), and placed on the mounting stage 7045. At this time, the substrate 200 is placed such that the portion in which the chips 400 have been mounted on the substrate 200 is in the upstream of the carrying direction (negative X direction side), and that a portion in which the chips 400 are not mounted on the substrate 200 is in the downstream of the carrying direction (positive X direction side). The mounting stage 7045 suctions and fixes the substrate 200 on its front surface (fourth suction (fixing) step).

As described previously, the mounting stage 7045 is the first type sectionalized stage divided into the heating section 70452 arranged in the downstream of the carrying direction of the substrate 200 and the non-heating section 70456 arranged in the upstream of the carrying direction of the substrate 200. The part of the substrate 200 in which the chips 400 are not mounted (the part suctioned and fixed to the heating section 70452) is heated up to around 70 degrees Celsius by the heater 70459. With this, as illustrated in FIG. 19(f) the temperature of the NCP (non-conductive paste) 201 applied to the substrate 200 of the part in which the chips 400 are not mounted also increases up to around 70 degrees Celsius. In contrast, as heat from the heater 70459 to the part in which the chips 400 have been mounted (the part suctioned and fixed to the non-heating section 70456) is blocked by the heat insulating layer 70454, its temperature gradually decreases (fourth heating step).

As previously described with reference to FIG. 6(c) through FIG. 7(n), the chip 400 is picked up from the pick up stage 55, inverted, and carried to the mounting block 7040 along the carrier path 111 of the chip carrying block 110 illustrated in FIG. 16.

As indicated by an alternate long and two short dashes line in FIG. 20(g), when the chip 400 that has been carried is suctioned to the suction surface 70442, the mounting tool 70441 heats the chip 400 up to about 300 degrees Celsius using a heater (not shown) provided in the tool, and mounts the chip 400 at a predetermined position on the substrate 200 suctioned and fixed to the heating section 70452 of the mounting stage 7045 as indicated by an arrow f in FIG. 20(g). As the temperature of the substrate 200 suctioned and fixed to the heating section 70452 and the NCP (non-conductive paste) 201 applied to this region of the substrate 200 is about 70 degrees Celsius, when the chip 400 that has been heated up to about 300 degrees Celsius is mounted, the bumps 401 formed on the mounting surface of the chip 400 are melted and joined to the electrodes on the substrate 200, the NCP (non-conductive paste) 201 is heated and cured, and the chip 400 is fixed and mounted on the substrate 200 (fourth mounting step).

In this fourth mounting step, similarly to the first mounting step described previously, upon completion of mounting of the chips 400 along every single line, the mounting stage 7045 is moved by an amount of one chip in the positive X direction by the XY table that is not shown, and mounting of the chips 400 along a next line is performed. Then, when the chips 400 are mounted to all of the predetermined positions on the substrate 200 suctioned and fixed to the heating section 70452 of the mounting stage 7045, the fourth mounting step on the mounting stage 7045 is terminated.

Upon completion of the fourth mounting step, the substrate 200 is picked up by the substrate carrying robot 82 illustrated in FIG. 16 from the mounting stage 7045, and carried to and placed on the carrier rail 86. The substrate 200 that is finished as a product upon completion of mounting of all the chips 400 is carried along the carrier rail 86 to the product storage block 90 by a carrier apparatus that is not shown. When a predetermined number of the substrates 200 are stored on the shelves of the product storage block 90, the substrates 200 in the product storage block 90 are carried to a curing apparatus that is not shown, and are subjected to curing for about an hour at temperature around 200 degrees Celsius, for example. With this, the NCP (non-conductive paste) 201 is fully cured.

As described above, this embodiment provides the flip chip mounting apparatus 700 including one pre-heating stage and one mounting stage that are the first type sectionalized stage (first type sectionalized mounting stage), wherein similarly to the embodiment described with reference to FIG. 1 through FIG. 9, the number of the chips 400 that can be mounted on the substrate 200 before the NCP (non-conductive paste) 201 transforms due to heat can be increased by inverting orientation of the substrate 200, as compared to the conventional flip chip mounting apparatus. Thus, it is possible to provide the effect of allowing to mount a large number of chips 400 on the substrate 200, while suppressing transformation of the NCP (non-conductive paste) 201 due to heat.

While the flip chip mounting apparatus is taken as an example in the embodiments described above, applications of the present invention are not limited to the flip chip mounting apparatus. The present invention can be applied to other types of mounting apparatuses for mounting chips on a substrate such as die bonding apparatuses, as well as to various types of devices for mounting electronic components on a substrate, for example, mounting electronic components such as LEDs.

The present invention is not limited to the embodiment described above, and includes any alterations and modifications without departing from the technical scope and the spirit of the present invention as defined in the appended claims.

The invention claimed is:

1. An electronic-component mounting apparatus for mounting electronic components to a substrate, the apparatus comprising:
    a paste application block, configured to apply a non-conductive paste at positions on the substrate at which the electronic components are to be mounted;
    a first sectionalized mounting stage, configured to heat the substrate that has the non-conductive paste applied on, the first sectionalized mounting stage is divided into a heating section and a non-heating section, the heating section being for heating the substrate fixed to a front surface of the heating section, the non-heating section not heating the substrate suctioned to a front surface of the non-heating section, only a portion of the substrate that is fixed to the heating section of the first sectionalized mounting stage is heated, and the electronic components are mounted to the positions in the heated portion; and
    a second sectionalized mounting stage, configured to heat the substrate that has the non-conductive paste applied on, the second sectionalized mounting stage is divided into a second heating section and a second non-heating section invertedly arranged with respect to the first sectionalized mounting stage, only a portion of the substrate that is fixed to the heating section of the second sectionalized mounting stage is heated, and the electronic components are mounted to the positions in the heated portion.

2. The electronic-component mounting apparatus according to claim 1, wherein
the first sectionalized mounting stage and the second sectionalized mounting stage each include:
a planar base body having a planar stepped portion; and
a heat insulating layer laid over the stepped portion such that a front surface of the heat insulating layer is in plane with a front surface of the planar base body, the substrate being fixed to the front surface of the planar base body and the front surface of the heat insulating layer,
the heating section is the front surface of the planar base body, and
the non-heating section is the front surface of the heat insulating layer.

* * * * *